(12) United States Patent
Suzuki et al.

(10) Patent No.: US 9,893,219 B2
(45) Date of Patent: Feb. 13, 2018

(54) GRAPHENE PHOTODETECTOR AND GRAPHENE OPTICAL MODULATOR

(71) Applicant: Kabushiki Kaisha Toshiba, Minato-ku (JP)

(72) Inventors: Nobuo Suzuki, Kamakura (JP); Yuichi Yamazaki, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 89 days.

(21) Appl. No.: 14/959,194

(22) Filed: Dec. 4, 2015

(65) Prior Publication Data

US 2016/0380121 A1     Dec. 29, 2016

(30) Foreign Application Priority Data

Jun. 25, 2015    (JP) .................................. 2015-127650

(51) Int. Cl.
| | | |
|---|---|---|
| *G02F 1/025* | (2006.01) | |
| *H01L 31/028* | (2006.01) | |
| *H01L 29/16* | (2006.01) | |
| *H01L 31/0224* | (2006.01) | |
| *H01L 31/0232* | (2014.01) | |

(Continued)

(52) U.S. Cl.
CPC .......... *H01L 31/028* (2013.01); *G02F 1/0123* (2013.01); *G02F 1/025* (2013.01); *H01L 27/1443* (2013.01); *H01L 29/1606* (2013.01); *H01L 31/02325* (2013.01); *H01L 31/022408* (2013.01); *H01L 31/105* (2013.01)

(58) Field of Classification Search
CPC ............................................... G02F 2001/0156
See application file for complete search history.

(56) References Cited

U.S. PATENT DOCUMENTS

| | | |
|---|---|---|
| 8,053,782 B2 | 11/2011 | Avouris et al. |
| 8,554,022 B1 | 10/2013 | Hochberg et al. |

(Continued)

FOREIGN PATENT DOCUMENTS

| | | |
|---|---|---|
| JP | 2013-502735 | 1/2013 |
| JP | 2013-88810 | 5/2013 |

(Continued)

OTHER PUBLICATIONS

Xuetao Gan et al. "Chip-Integrated Ultrafast Graphene Photodetector with High Responsivity", Nature Photonics, vol. 7, Nov., 2013, 5 pages.

(Continued)

*Primary Examiner* — Chris Chu
(74) *Attorney, Agent, or Firm* — Oblon, McClelland, Maier & Neustadt, L.L.P.

(57) ABSTRACT

According to one embodiment, a graphene photodetector includes a substrate, a first insulating film, first and second high-refractive-index regions, first and second conductive semiconductor regions, a second insulating film, a graphene film, a third insulating film, third and fourth high-refractive-index regions, a fourth insulating film, first and second electrodes, and third and fourth electrodes. The first, second, third and fourth high-refractive-index regions and portions sandwiched by the first, second, third and fourth high-refractive-index regions constituting an integrated optical waveguide.

7 Claims, 13 Drawing Sheets

(51) Int. Cl.
    *H01L 31/105*     (2006.01)
    *H01L 27/144*     (2006.01)
    *G02F 1/01*     (2006.01)

(56) References Cited

U.S. PATENT DOCUMENTS

| | | | |
|---|---|---|---|
| 8,604,462 | B2 | 12/2013 | Kim |
| 8,648,342 | B2 | 2/2014 | Kim et al. |
| 2013/0101247 | A1* | 4/2013 | Cho .................. G02F 1/025 385/1 |
| 2013/0107344 | A1 | 5/2013 | Avouris et al. |
| 2014/0023321 | A1 | 1/2014 | Lu et al. |
| 2014/0056551 | A1 | 2/2014 | Liu et al. |
| 2014/0319357 | A1 | 10/2014 | Ogawa et al. |

FOREIGN PATENT DOCUMENTS

| | | |
|---|---|---|
| JP | 2015-45629 | 3/2015 |
| JP | 2015-65348 | 4/2015 |

OTHER PUBLICATIONS

Y. T. Hu et al. "Broadband 10Gb/s Graphene Electro-Absorption Modulator on Silicon for Chip-Level Optical Interconnects", Electron Devices Meeting (IEDM), 2014 IEEE International, 2014, 4 pages.

Kinam Kim et al. "A Role for Graphene in Silicon-Based Semiconductor Devices", Nature, vol. 479, Nov. 17, 2011, 7 pages.

Ming Liu et al. "Double-Layer Graphene Optical Modulator", Nano Letters, vol. 12, 2012, 4 pages.

\* cited by examiner

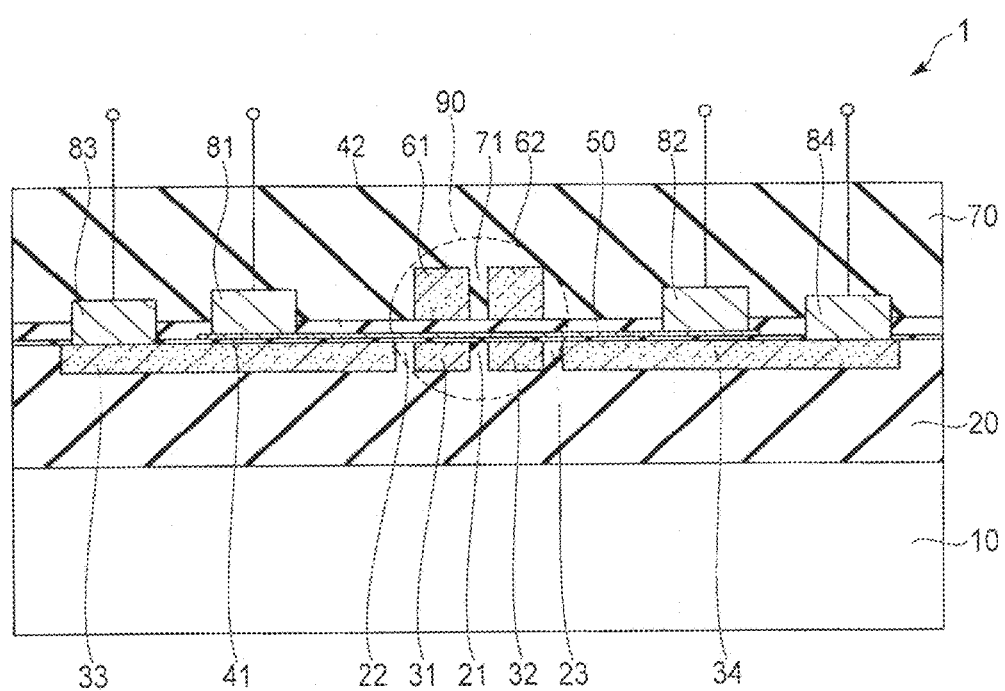
F I G. 1

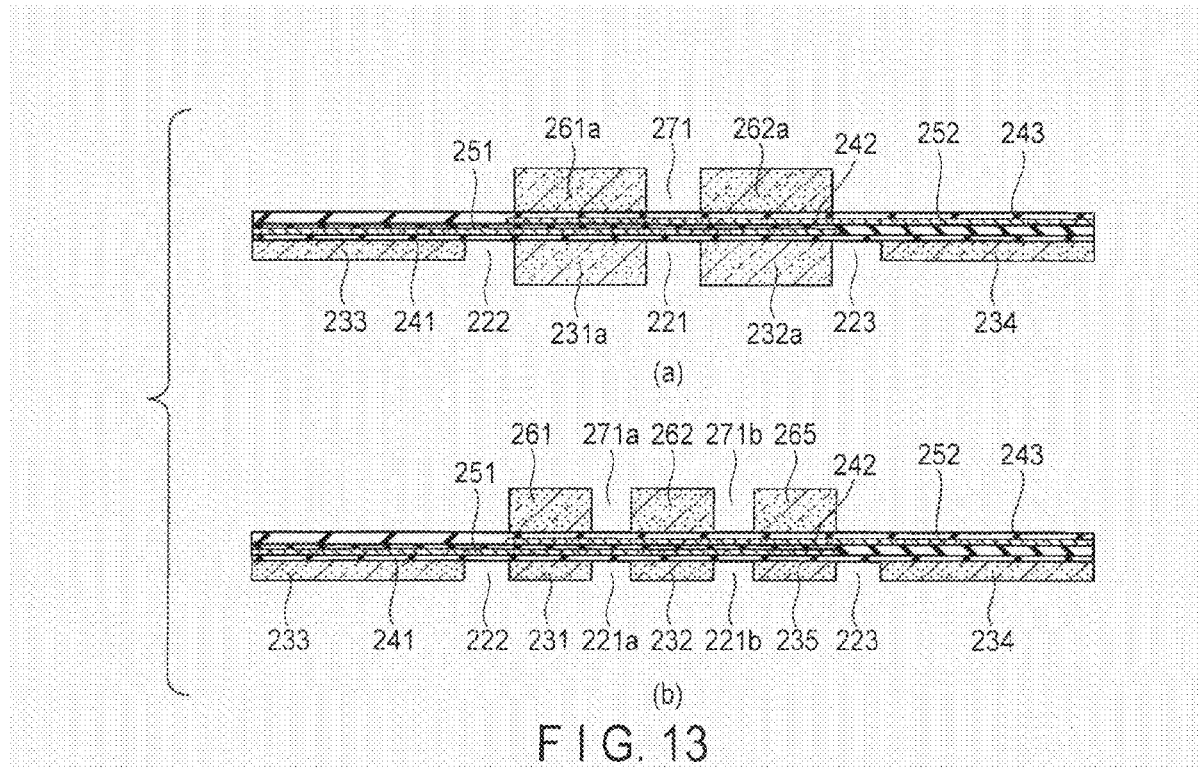
F I G. 13
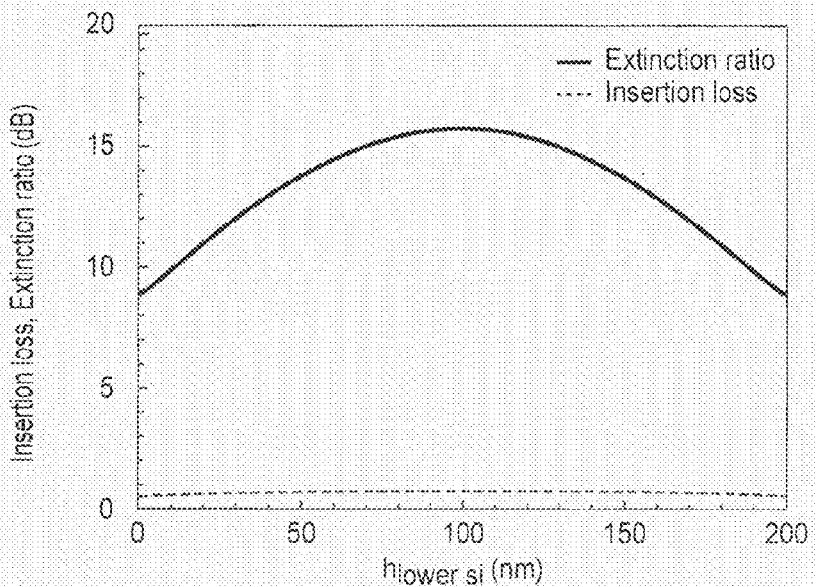
F I G. 14

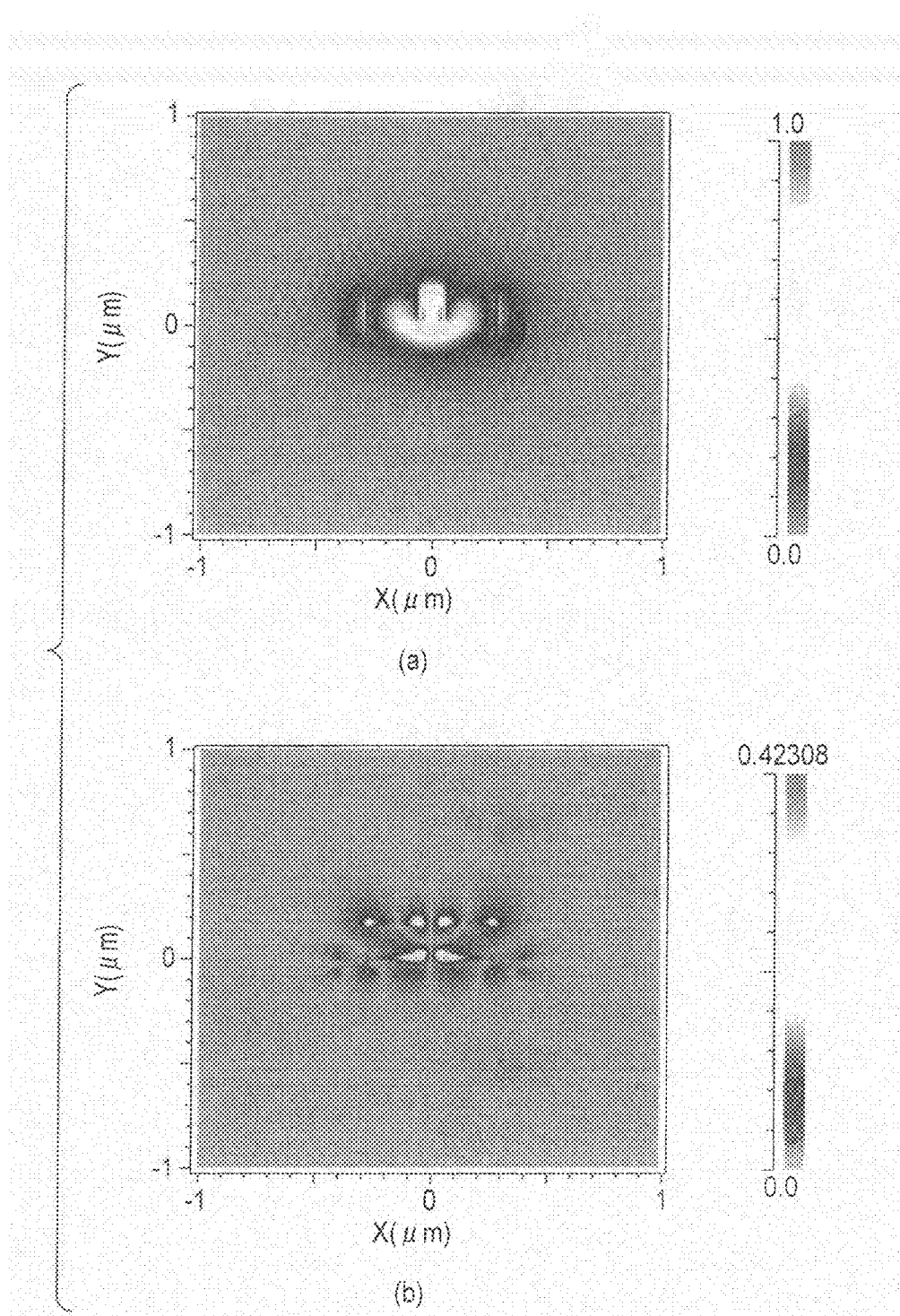
F I G. 18

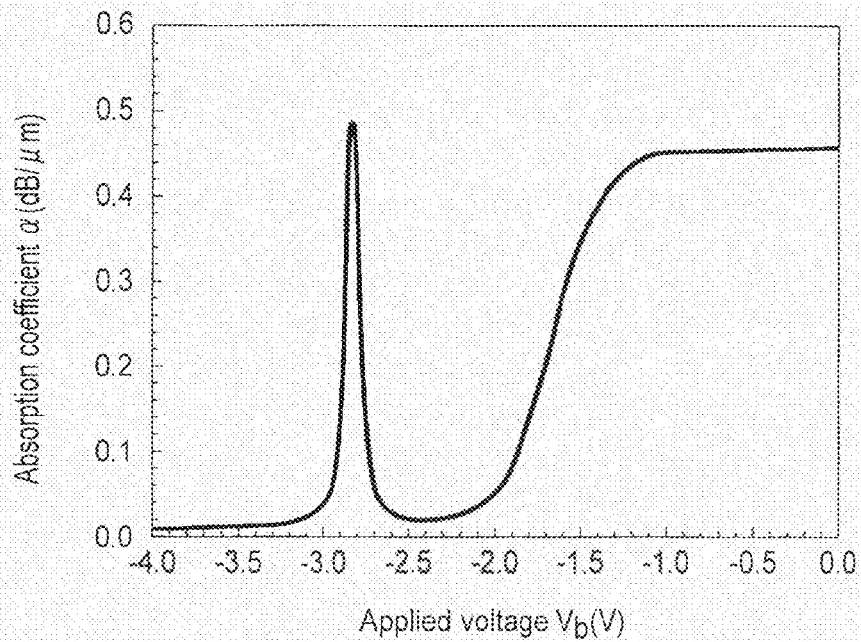
F I G. 19
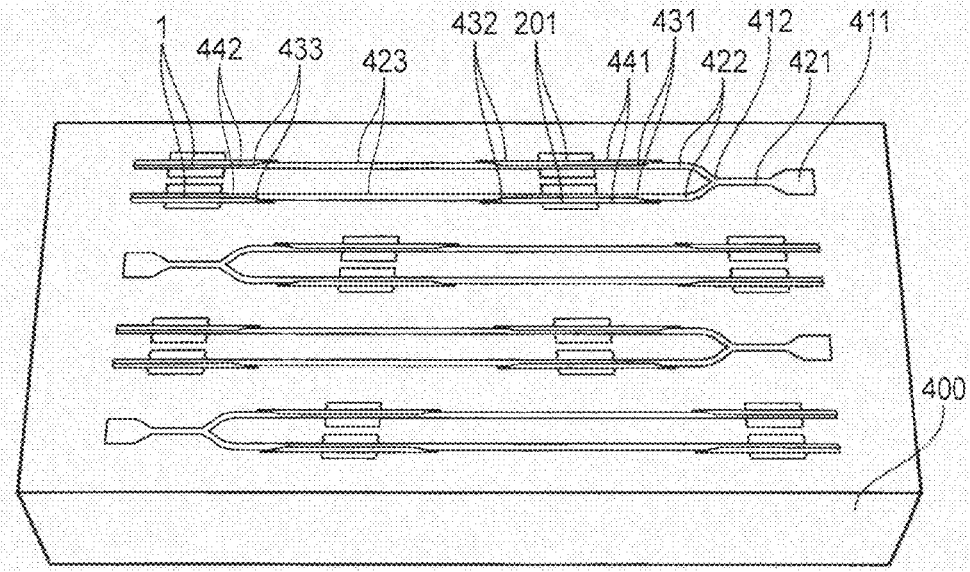
F I G. 20

GRAPHENE PHOTODETECTOR AND GRAPHENE OPTICAL MODULATOR

CROSS-REFERENCE TO RELATED APPLICATIONS

This application is based upon and claims the benefit of priority from Japanese Patent Application No. 2015-127650, filed Jun. 25, 2015, the entire contents of which are incorporated herein by reference.

FIELD

Embodiments described herein relate generally to a graphene photodetector and a graphene optical modulator to which light is input from an optical waveguide.

BACKGROUND

Graphene is a sheet-like substance in which carbon atoms are arranged in a honeycomb pattern, with a thickness of approximately 0.334 nm. The conduction band and the valence band of graphene can approximate in symmetrical cones having their vertexes contacted with each other at a K point (Dirac point) in a Brillouin zone. Graphene is expected as a material of next-generation electronics since the Fermi level $E_F$ of pure single-layer graphene is at the Dirac point ($E_F$=0 eV) and electrons near the Dirac point have a carrier mobility not less than 10,000 $cm^2V^{-1}s^{-1}$.

In addition, graphene is also noted as a material of optical device application since graphene has a property of absorbing light in a wide wavelength range of from visible to infrared light.

It is known that graphene acts as a photodetector if holes and electrons generated by light absorption are extracted as a photocurrent before recombination by utilizing the high mobility of graphene and a built-in field in a graphene. In general, however, a photocurrent extraction efficiency of the graphene photodetector is low.

In addition, a graphene-based optical modulator is also known. In general, however, an extinction ratio of the graphene optical modulator is low.

BRIEF DESCRIPTION OF THE DRAWINGS

FIG. 1 is a schematic cross-sectional view showing a graphene photodetector of an embodiment.

FIG. 13 is a schematic illustration showing two modifications of the graphene optical modulator of the embodiment.

FIG. 14 is a graph showing an extinction ratio and an insertion loss when a thickness ratio between lower and upper high-refractive-index regions is varied.

FIG. 18 is a graph showing a mode profile of (a) $E_x$ component and (b) Ey component of the TE mode light propagating a slot waveguide of the graphene optical modulator of the modification shown in FIG. 17.

FIG. 19 is a graph showing a voltage dependence of a light absorption coefficient in the modification shown in FIG. 17.

FIG. 20 is a schematic illustration showing a graphene optical modulator in which the graphene photodetectors of the embodiment are integrated on a single substrate.

DETAILED DESCRIPTION

Figure 2:
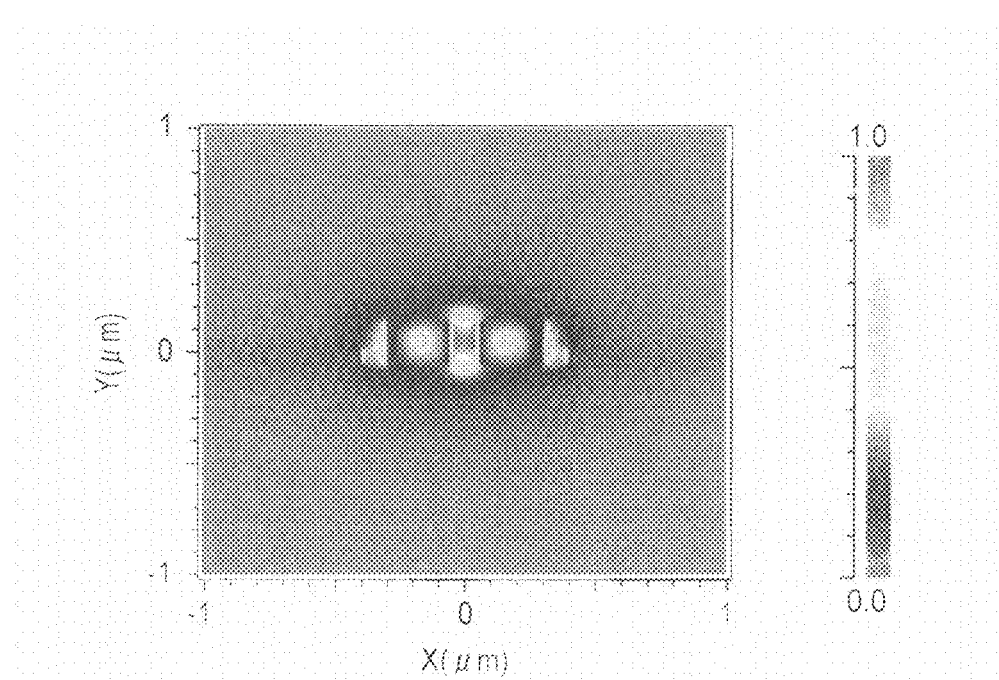
FIG. 2 is an illustration showing a profile of an electric field component $E_x$ parallel to a substrate of TE mode light.

In general, according to one embodiment, a graphene photodetector is provided, which comprises a substrate, a first insulating film, first and second high-refractive-index regions, first and second conductive semiconductor regions, a second insulating film, a graphene film, a third insulating film, third and fourth high-refractive-index regions, a fourth insulating film, first and second electrodes, and third and fourth electrodes. The first insulating film is provided on the substrate. The first and second high-refractive-index regions are provided in a surface region of the first insulating film, and are spaced apart from each other with a first gap therebetween. The first and second conductive semiconductor regions are provided on sides of the first and second high-refractive-index regions opposite to the second and first high-refractive-index regions, respectively, and are spaced apart with second and third gaps between the first high-refractive-index region and the first conductive semiconductor region, and between the second high-refractive-index region and the second conductive semiconductor region, respectively. The second insulating film is provided to cover surfaces of the first and second high-refractive-index regions, and the first, second and third gaps, and to extend onto the first and second conductive semiconductor regions. The graphene film is provided on the second insulating film to span the first, second and third gaps. The third insulating film is provided to cover the graphene film and to extend onto the second insulating film. The third and fourth high-refractive-index regions are provided on the third insulating film, at locations corresponding to the first and second high-refractive-index regions, respectively, and are spaced apart with a fourth gap therebetween. The fourth insulating film is provided to cover the third and fourth high-refractive-index regions and to extend onto the third insulating film. The first and second electrodes are provided on the graphene film, on sides of the third and fourth high-refractive-index regions opposite to the fourth and third high-refractive-index regions, respectively, to electrically contact with the graphene film. The third and fourth electrodes are provided to electrically contact with the first and second conductive semiconductor regions, respectively. Each of the first to fourth high-refractive-index regions has a refractive index higher than the indexes of the first insulating film and the second insulating film. The first, second, third and fourth high-refractive-index regions and portions sandwiched by the first, second, third and fourth high-refractive-index regions constitute an integrated optical waveguide. A photocurrent corresponding to light incident on the optical waveguide is output from the first and second electrodes.

According to another embodiment, a graphene optical modulator is provided, which comprises a substrate, a first insulating film, first and second high-refractive-index regions, first and second conductive semiconductor regions, a second insulating film, a first graphene film, a third insulating film, a second graphene film, a fifth insulating film, third and fourth high-refractive-index regions, a fourth insulating film, first and second electrodes, and third and fourth electrodes. The first insulating film is provided on the substrate. The first and second high-refractive-index regions are provided in a surface region of the first insulating film, and are spaced apart from each other with a first gap therebetween. The first and second conductive semiconductor regions are provided on sides of the first and second high-refractive-index regions opposite to the second and first high-refractive-index regions, respectively, and are spaced apart with second and third gaps between the first high-refractive-index region and the first conductive semiconductor region, and between the second high-refractive-index region and the second conductive semiconductor region, respectively. The second insulating film is provided to cover surfaces of the first and second high-refractive-index regions, and the first, second and third gaps, and to extend onto the first and second conductive semiconductor regions. The first graphene film is provided on the second insulating film to span the first and second gaps. The third insulating film is provided to cover the first graphene film and to extend onto the second insulating film. The second graphene film is provided on the third insulating film to span the first and third gaps. The fifth insulating film is provided to cover the second graphene film and to extend on the third insulating film. The third and fourth high-refractive-index regions are provided on the fifth insulating film, at locations corresponding to the first and second high-refractive-index regions, respectively, and are spaced apart with a fourth gap therebetween. The fourth insulating film is provided to cover the third and fourth high-refractive-index regions and to extend on the fifth insulating film. The first electrode is provided on the first graphene film, on a side of the third high-refractive-index region opposite to the fourth high-refractive-index region to electrically contact with the first graphene film. The second electrode is provided on the second graphene film, on a side of the fourth high-refractive-index region opposite to the third high-refractive-index region to electrically contact with the second graphene film. The third and fourth electrodes are provided to electrically contact with the first and second conductive semiconductor regions, respectively. Each of the first to fourth high-refractive-index regions has a refractive index higher than the indexes of the first insulating film and the forth insulating film. The first, second, third and fourth high-refractive-index regions and portions sandwiched by the first, second, third and fourth high-refractive-index regions constitute an integrated optical waveguide. An intensity of light propagating in the optical waveguide is modulated corresponding to a voltage applied between the first electrode and the second electrode.

Various embodiments will now be described below with reference to the accompanying drawings.

For convenience of explanations, length-to-width ratios, dimensions, etc., of the drawings are different from actual length-to-width ratios and dimensions. Portions which are not related to the inventive essence are not shown in the drawings nor explained.

Terms such as "upper", "lower", "left" and "right" corresponding to the drawings are used to indicate relative positional relationship of components, etc., for convenience, in the specification, but do not define actual orientation of the elements and, for example, structures in which entire elements are laterally reversed are equivalent. In addition, numerical values of dimensions, carrier density, voltages, etc., are exemplified as an embodiment and may not define indispensable constituent elements of the embodiments unless particularly recited in claims.

FIG. 1 is a schematic cross-sectional view showing a graphene photodetector 1 according to one embodiment.

The graphene photodetector 1 of the present embodiment comprises a Si substrate 10. A first $SiO_2$ layer (first insulating film) 20 is disposed on the Si substrate 10. A first Si stripe (first high-refractive-index region) 31 and a second Si stripe (second high-refractive-index region) 32 are disposed and spaced apart with a first gap 21, and a first n-type Si region 33 and a second n-type Si region 34 are arranged on left and right outer sides of the first Si stripe 31 and the second Si stripe 32 and spaced apart with a second gap 22 and a third gap 23, respectively, in a surface region of the first $SiO_2$ layer 20. The n-type Si region is a semiconductor region which becomes electrically conductive by being doped in n type, and a semiconductor region which becomes electrically conductive by doping is also hereinafter called a conductive semiconductor region or a conductive Si region. The first Si stripe 31, the second Si stripe 32, the first n-type Si region 33 and the second n-type Si region 34 are extended in the same length in a direction perpendicular to a sheet of FIG. 1. A first $Al_2O_3$ film (second insulating film) 41 is disposed to include surfaces of the structures 31 to 34 and cover the surface of the first $SiO_2$ layer 20. A graphene film 50 is disposed on the first $Al_2O_3$ film 41. The graphene film 50 extends over the first gap 21, the second gap 22 and the third gap 23. A second $Al_2O_3$ film (third insulating film) 42 is disposed to cover the graphene film 50 and the first $Al_2O_3$ film 41. A third Si stripe (third high-refractive-index region) 61 and a fourth Si stripe (fourth high-refractive-index region) 62 are disposed and spaced apart with a fourth gap 71, at positions corresponding to the first Si stripe 31 and the second Si stripe 32, respectively, on the second $Al_2O_3$ film 42. A second $SiO_2$ layer (fourth insulating film) 70 is disposed on the second $Al_2O_3$ film 42 to cover the third Si stripe 61 and the fourth Si stripe 62. Each of the first to fourth Si stripes 31, 32, 61 and 62 has a refractive index higher than the indexes of the first $SiO_2$ layer 20 and the second $SiO_2$ layer 70. On left and right outer sides of the third Si stripe 61 and the fourth Si stripe 62, a first electrode 81 and a second electrode 82 in electric contact with the graphene film 50 are disposed, and a third electrode 83 and a fourth electrode 84 in electric contact with the first n-type Si region 33 and the second n-type Si region 34 are disposed.

The first Si stripe 31, the second Si stripe 32, the first n-type Si region 33 and the second n-type Si region 34 can be formed to have the same thickness of, for example, 50 nm. In addition, a thickness of the first $SiO_2$ layer 20 from lower surfaces of the regions 31 to 34 to the Si substrate 10 can be set to be, for example, 2 μm. The first Si stripe 31 and the second Si stripe 32 are not intentionally doped, and the stripe width can be set at, for example, 250 nm. The first n-type Si region 33 and the second n-type Si region 34 become in the n type by, for example, phosphorous (P) ion implantation and annealing.

Examples of a method of forming the Si stripe 31, the Si stripe 32, the n-type Si region 33 and the n-type Si region 34 include etching a top Si layer of a silicon-on-insulator (SOI) substrate, in which a buried oxide (BOX) layer 20 and the top Si layer are formed on the Si substrate 10, exposing a surface of the BOX layer except portions which are to be Si stripe 31, the Si stripe 32, the n-type Si region 33 and the n-type Si region 34; burying these structures with an $SiO_2$ layer; and flattening the Si stripe 31, the Si stripe 32, the n-type Si region 33 and the n-type Si region 34 by chemical mechanical polishing (CMP) such that the Si stripe 31, the Si stripe 32, the n-type Si region 33 and the n-type Si region 34 have a predetermined thickness.

Alternatively, the Si stripe 31, the Si stripe 32, the n-type Si region 33 and the n-type Si region 34 can be formed by forming an $SiO_2$ layer 20 on the substrate 10, forming and patterning an n-type poly-Si layer on the $SiO_2$ layer to form the n-type Si region 33 and the n-type Si region 34. Then, burying the n-type Si region 33 and the n-type Si region 34 with the $SiO_2$ layer; flattening the $SiO_2$ layer by CMP; forming trenches at portions where the Si stripe 31 and the Si stripe 32 are to be formed on the buried $SiO_2$ layer; burying the trenches with a-Si; and flattening the Si stripe 31, the Si stripe 32, the n-type Si region 33 and the n-type Si region 34 by CMP such that they have a predetermined thickness.

The first gap 21 formed between the first Si stripe 31 and the second Si stripe 32, the second gap 22 formed between the first Si stripe 31 and the first n-type Si region 33, and the third gap 23 formed between the second Si stripe 32 and the second n-type Si region 34 have equal widths, which can be set at, for example, 100 nm. In the embodiment shown in FIG. 1, the first gap 21, the second gap 22, and the third gap 23 are filled with $SiO_2$. However, the first gap 21, the second gap 22, and the third gap 23 do not need to be necessarily filled with $SiO_2$ (first insulating film 20) but some parts or all parts of the gaps may be replaced with the other materials having a low refractive index and giving no bad influence to light propagation, vacuum, etc. In addition, for example, space may be formed in $SiO_2$ (first insulating film 20) in the first gap 21, the second gap 22, and the third gap 23.

The thicknesses of the first $Al_2O_3$ film 41 and the second $Al_2O_3$ film 42 can be set at, for example, 5 nm and 7 nm, respectively.

The graphene film 50 can be formed by transferring single-crystal monolayer graphene grown by chemical vapor deposition (CVD) on Cu foil which has a surface flattened by polishing and high-pressure annealing, on the first $Al_2O_3$ film 41.

In the graphene film 50, the Fermi level is adjusted to be close to the Dirac point by removing adsorbed particles by processing such as annealing, after transferring and patterning, and, for example, the mobility can be set at $2 \times 10^5$ $cm^2V^{-1}s^{-1}$ and the sheet resistance can be set at 2.5 kΩ/□ in a state of applying no voltage.

The third Si stripe 61 and the fourth Si stripe 62 can be formed by processing undoped amorphous silicon (a-Si) deposited on the second $Al_2O_3$ film 42, in a stripe shape, such that the amorphous silicon is located at portions which correspond to the first Si stripe 31 and the second Si stripe 32, respectively. The third Si stripe 61 and the fourth Si stripe 62 can be formed to have, for example, a thickness of 125 nm and a stripe width of 250 nm. The fourth gap 71 between the third Si stripe 61 and the fourth Si stripe 62 can be formed to have a width of, for example, 100 nm and is buried with the second $SiO_2$ layer 70. However, the fourth gap 71 does not need to be filled with $SiO_2$ (fourth insulating film 70) but some parts or all parts of the gap may be replaced with the other material having a low refractive index and giving no bad influence to light propagation, vacuum, etc. In addition, for example, space may be formed in $SiO_2$ (fourth insulating film 70) in the fourth gap 71.

The first electrode 81 can be formed of Ti (10 nm)/Au while the second electrode 82 can be formed of Au. The graphene film under Ti of the first electrode 81 is in the n type and the graphene film under Au of the second electrode 82 is in the p type due to charge transfer between metal and graphene. Graphene can also be formed to be in the n type by using an electrode of Al/Au, etc. Graphene can also be formed to be in the p type by using an electrode of Pt/Au, Pd/Au, etc.

The first electrode 81 and the second electrode 82 can be disposed on the graphene film 50 in a method such as lift-off.

The third electrode 83 and the fourth electrode 84 can be formed of, for example, nickel silicide. A width of an interval between the third Si stripe 61 and the first electrode 81 and a width of an interval between the fourth Si stripe 62 and the second electrode 82 can be set at, for example, 800 nm. The widths may be maintained such that the electrodes do not give a bad influence to an electromagnetic component of the light propagating an optical waveguide 90 to be explained later.

The graphene photodetector 1 to which the concrete materials and numerical values exemplified in the embodiment are applied can be used within a wide wavelength range of a near-infrared region, and is designed to receive intensity-modulated signal light having a wavelength band of 1.31 μm. When the wavelength is 1.31 μm, refractive index $n_{Si}$ of Si is 3.501, refractive index $n_{SiO2}$ of $SiO_2$ is 1.447, and a refractive index of $Al_2O_3$ is 1.75. The first to fourth Si stripes 31, 32, 61 and 62, portions sandwiched by the Si stripes, and the structures close to the portions form the single-TE mode optical waveguide (slot waveguide) 90. In the slot waveguide, high-refractive-index optical waveguide structural portions on both sides of the slots (first and fourth gaps) 21 and 71 are called "rails". In the graphene photodetector of the present embodiment, the first to fourth Si stripes 31, 32, 61 and 62 correspond to rails.

FIG. 2 shows a profile of an electric field component $E_x$ parallel to a substrate of a fundamental transverse electric (TE) mode light having a wavelength of 1.31 μm which propagates the slot waveguide 90 of the graphene photodetector 1 to which the concrete materials and numerical values exemplified in the embodiment are applied. The X axis and the Y axis in FIG. 2 correspond to a horizontal direction and a vertical direction of the photodetector 1, respectively. Central axes of the first gap 21 and the fourth gap 71 of the photodetector 1 correspond to X=(μm) in FIG. 2, and a boundary between the $SiO_2$ layer 20 and the first $Al_2O_3$ film 41 of the photodetector 1 corresponds to Y=0 (μm) in FIG. 2. FIG. 2 is drawn without deformation. The optical field intensity $E_x$ shows maximum value 1 in the first gap 21 and the fourth gap 71. A relationship between colors and the optical field intensity $E_x$ in FIG. 2, where the optical field intensity $E_x$ has a maximum value of 1 and a minimum value of 0, is shown on the right side of FIG. 2. The electric field intensity on the $SiO_2$ side of the side walls of the Si stripes 31, 32, 61 and 62 is enhanced by $(3.501/1.447)^2 = 5.85$ times compared with the electric field intensity on the Si side, under a boundary condition that electric flux density $D_x = \epsilon_0 \epsilon_r E_x$ perpendicular to an interface is continuous, where $\epsilon_0$ is a permittivity in vacuum and $\epsilon_r = n^2$ indicates a relative dielectric constant of materials. For this reason, the optical field intensity $E_x$ becomes highest in the first gap 21 and the fourth gap 71, which are referred to as main slots since the optical field intensity $E_x$ is highest, sandwiched by the Si stripes 31, 32, 61 and 62. The optical field intensity $E_x$ is also enhanced in the second gap 22 and the third gap 23, which are referred to as sub-slots since the optical field intensity $E_x$ is enhanced but is not higher than that in the main slots. Peaks can also be seen in the Si stripes 31, 32, 61 and 62, which are referred to as sub-peaks since the optical field intensity $E_x$ is lower than the optical fields in the main slots 21 and 71 and the sub-slots 22 and 23, but the optical field hardly leaks to the conductive Si regions 33 and 34. For this reason, light absorption loss at the first electrode 81, the second electrode 82 and the conductive Si regions 33 and 34 can be neglected. In FIG. 2, the graphene film 50 is located near Y=0.005 μm, since the boundary between the $SiO_2$ layer 20 and the first $Al_2O_3$ film 41 in the photodetector 1 is set at Y=0 (μm), and the first $Al_2O_3$ film 41 has a thickness of 5 nm (0.005 μm). In the graphene film 50, $E_x$ component of the optical field is enhanced at the slot portions.

The length of the graphene photodetector 1 of the present embodiment, i.e., the length of the graphene film 50 in a direction perpendicular to a sheet of FIG. 1 can be set at, for example, 50 μm. The absorption coefficient of the optical waveguide 90 is 0.27 dB/μm, and 95.6% of the incidence power are absorbed by the graphene film 50 while the light propagates for 50 μm. In the graphene film 50, the incidence power is absorbed most strongly in the main slot regions 21 and 71 and then absorbed in the sub-slot regions 22 and 23 and the Si stripes 31, 32, 61 and 62. Since extension of the mode to the conductive Si regions 33 and 34 is suppressed due to the presence of the sub-slots 22 and 23, the light power absorbed in the portions (electronic wiring regions) of the graphene film corresponding to the conductive Si regions 33 and 34 is suppressed to 1% or less of the entire optical power absorbed by the graphene film 50.

The graphene photodetector 1 of the present embodiment can be connected to, i.e., integrated with the other optical elements by the Si-channel waveguide. The TE-mode light which propagates in the Si-channel waveguide is made incident on the graphene photodetector 1 of the present embodiment via a mode converter for a channel waveguide and a slot waveguide. The mode converters for the channel waveguide and the slot waveguide are designed in various types. The length of a mode conversion portion can be reduced to 20 μm or less and the insertion loss can be suppressed to 0.1 dB or less by using a state-of-the art mode converter.

If a polarization mode of the incident light is uncertain, for example, if the light propagating through an optical fiber having no polarization maintaining function is made incident on the Si-channel waveguide, polarization diversity reception may be executed. In other words, the Si-channel waveguide incident light may be divided into light of the TE mode and light of the transverse magnetic (TM) mode by a polarization beam splitter, and the light of the TE mode as it is and light of TE mode obtained by converting the light of the TM mode by a TM-TE mode converter may be received through different mode converters of the channel waveguides and the slot waveguides, by different graphene photodetectors 1, and two electric outputs may be summed up in a receiver circuit.

Figure 3:
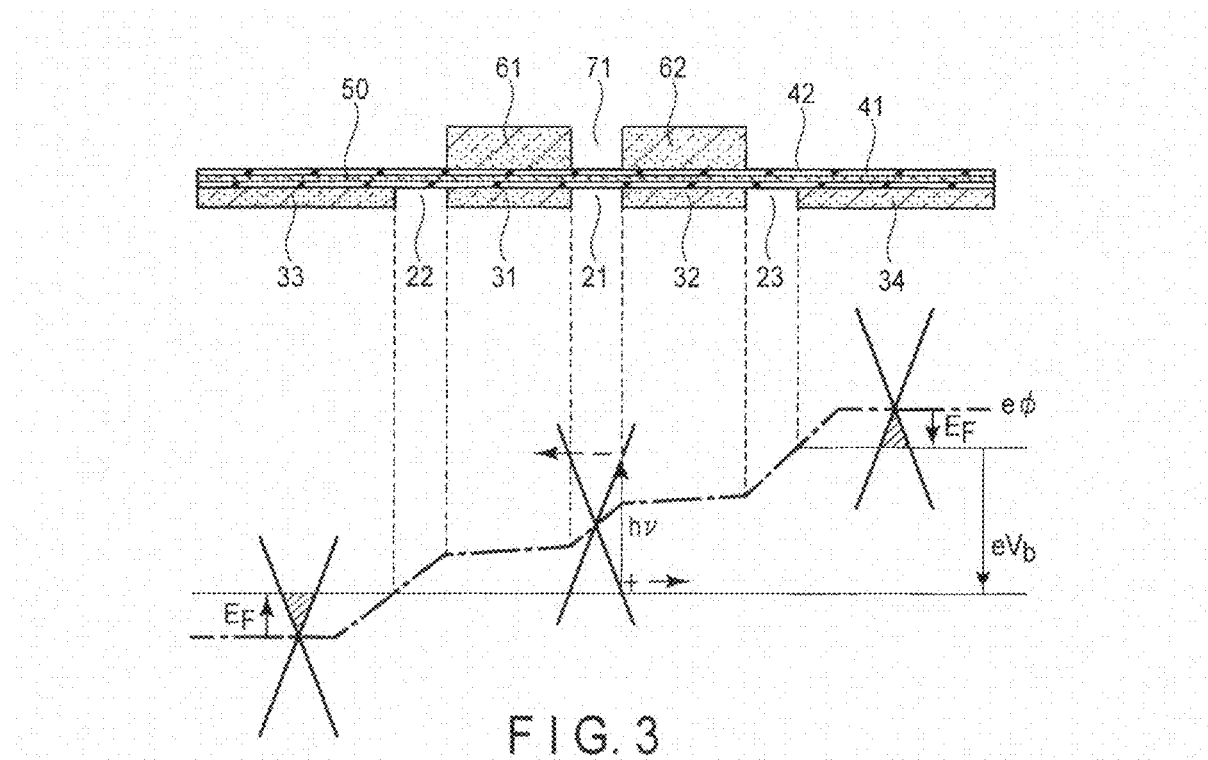
FIG. 3 is a conceptual illustration of a state of a band and a state of potential for electrons in a graphene film of the graphene photodetector of the embodiment.

FIG. 3 schematically shows a state of a band in the graphene film 50 to which the voltage is applied, and a state of the potential eφ, which is drawn by a one-dot-chained line, for the electrons. The states are drawn to correspond to arrangement of major portions of the photodetector shown at an upper part of FIG. 3. Here, e represents an electronic elementary charge and $eV_b$ represents potential energy (eV unit) corresponding to voltage $V_b$ (V unit). The sign of the potential to the electrons (e<0) is opposite to the sign of the voltage, and an upward arrow represents a positive value and a downward arrow represents a negative value. As explained later, electrons and holes are induced to a portion of the graphene film 50 corresponding to the first n-type Si region 33 and a portion of the graphene film 50 corresponding to the second n-type Si region 34, respectively, by a back gate, and the Fermi level is shifted by $+E_F$ and $-E_F$ from the Dirac point. Since a bias voltage $V_b$ which is positive to the second electrode 82 is applied to the first electrode 81, the Fermi level of the first n-type Si region 33 is at a level lower by $eV_b$ than the Fermi level of the second n-type Si region 34, and the graphene film is depleted by the electric field. (In fact, voltage drop occurs in the graphene film of the back gate portion due to the dark current and series resistance but is not shown for simplicity of explanations.)

Figure 4:
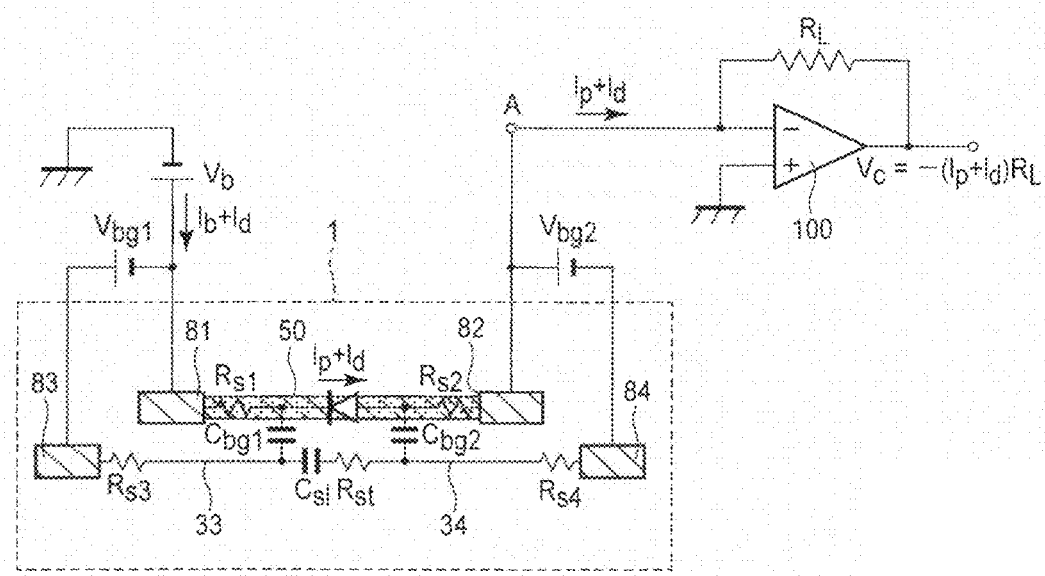
FIG. 4 is a diagram showing an equivalent circuit of the graphene photodetector of the embodiment, and an example of an external circuit connected thereto.

FIG. 4 is a diagram for explanation of an equivalent circuit of the graphene photodetector 1 of the embodiment, and an example of an external circuit connected to the photodetector 1 of the embodiment via first to fourth electrodes 81, 82, 83 and 84.

The positive bias voltage $V_b$ (>0) is applied to the first electrode 81. The second electrode 82 is connected to a transimpedance preamplifier composed of an operational amplifier 100 and a feedback resister $R_L$ and is virtually grounded. A back gate voltage higher than the first electrode 81 by $Vb_{g1}$ is applied to the third electrode 83. Since a capacitor $Cb_{g1}$ is constituted by the graphene film 50 and the first n-type Si region 33 with the first $Al_2O_3$ film 41 sandwiched therebetween, a depletion layer (inverted layer in a case where the back gate voltage is high) is formed on a surface of the first n-type Si region 33 and the electrons are induced on the graphene film 50 at a portion facing to the n-type Si region 33. In other words, the graphene film in this region is the n-type region. Similarly, a voltage lower than the second electrode 82 by $Vb_{g2}$ is applied to the fourth electrode 84. Since a capacitor $Cb_{g2}$ is constituted by the graphene film 50 and the second n-type Si region 34 with the first $Al_2O_3$ film 41 sandwiched therebetween, an accumulation layer is formed on a surface of the second n-type Si region 34 and the holes are induced on the graphene film 50 at a portion facing to the second n-type Si region 34. In other words, the graphene film in this region is the p-type region.

For example, if the back gate voltage is assumed to be $Vb_{g1} = Vb_{g2} = 1V$, electrons of approximately $4.5 \times 10^{12}$ cm$^{-2}$ are induced at the portion of the graphene film 50 opposed to the first n-type Si region 33 and holes of approximately $4.5 \times 10^{12}$ cm$^{-2}$ are induced at the portion of the graphene film 50 opposed to the second n-type Si region 34. The Fermi level $E_F$ is approximately +0.25 eV at the former portion and −0.25 eV at the latter portion. The inter-band absorption of the graphene is hardly suppressed at the doping of this degree. Since most of minority carriers generated by the light absorption in the wiring region is recombined soon, it cannot be extracted as the photocurrent. As explained above, however, since the ratio of the light absorbed in the wiring region is below 1% of full power of the light absorbed by the graphene film 50, influence to the quantum efficiency is weak.

The sheet resistance of the graphene film 50 to which the carriers are induced by the back gate is reduced to 250Ω/☐. Since the wiring width is 50 μm (=photodetector length) and the wiring length is 700 nm, the resistance in each of the wiring regions is 3.5Ω. In addition, since the back gate is also applied under the first electrode 81 and the second electrode 82 and since the graphene and the wiring regions under the electrodes are in the same conductive type, the contact resistance is suppressed to 1.5Ω. In the equivalent circuit shown in FIG. 4, a series resistance (sum of the contact resistance and the sheet resistance) is $R_{s1}=R_{s2}=5\Omega$ and is suppressed to a sufficiently small value as compared with the feedback resistance RL of the operational amplifier 100.

The graphene at the portion overlapping the slot waveguide 90 remains in an intrinsic state. An intrinsic carrier density of the graphene at application of no voltage, at room temperature (i.e., carrier density in a case where both pseudo-Fermi levels of the electrons and holes are at the Dirac point) is $n_i=9 \times 10^{10}$ cm$^{-2}$ but, in general, the carrier density in the intrinsic (i) region of the graphene film 60 is in the order of $10^{11}$ cm$^{-2}$ due to presence of defects and impurities (i.e., the pseudo-Fermi level of the electrons is higher than the Dirac point while the pseudo-Fermi level of the holes is lower than the Dirac point). When a positive bias voltage $V_b$ is applied to the first electrode 81 in this state, the intrinsic region of the graphene film 50 is depleted as shown in FIG. 3 (i.e., the pseudo-Fermi level of the electrons becomes lower than the Dirac point while the pseudo-Fermi level of the holes becomes higher than the Dirac point). The graphene photodetector 1 of the present embodiment in the state in which the back gate is applied therefore functions as a pin photodiode.

Since the intrinsic region of the graphene film 50 has a width of 800 nm, an average of the electric field intensity applied to the intrinsic region is 10 kV/cm if the bias voltage is $V_b=0.8$V. When the electric field intensity is 10 kV/cm, an electron saturation velocity in the graphene film 50 is $4 \times 10^7$ cm/s and has overshoot at a maximum velocity of approximately $5 \times 10^7$ cm/s at the acceleration. If the average speed is $4 \times 10^7$ cm/s and the average running distance is 400 nm, the average transit time of the carriers is estimated to be 1 ps. The electrons and the holes generated inside the main slots 21 and 71 in which the light power is concentrated are immediately accelerated in opposite directions. The hole density is low on the left sides of the main slots 21 and 71 while the electron density is low on the right sides of the main slots 21 and 71. For this reason, a carrier lifetime is longer than that in a case where an electric field is not present. If it is assumed that the carrier lifetime is 5 ps and the carrier transit time is 1 ps, 83% of the photo-generated carriers can be extracted as photocurrent before recombination.

Actually, the electric fields in the portions sandwiched by the lower Si stripes 31 and 32 and the upper Si stripes 61 and 62 are lowered due to influence of the electric charges induced on surfaces of the Si stripes, while the electric fields in the slot portions 21 and 71 become higher in accordance with this. In case deceleration caused by lowering of the electric fields in the portions sandwiched by the Si stripes is serious, the carrier transit time can be reduced by raising the applied voltage $V_b$ or the reducing the widths of the Si stripes.

If polycrystalline graphene including a number of crystalline grain boundaries and crystal defects is used as the graphene film 50, the saturation velocity in the intrinsic region is lowered and an efficiency of extracting the photocurrent is deteriorated. Therefore, to make good use of features of the graphene photodetector 1 of the present embodiment, the graphene film 50 should desirably be single-crystal graphene.

The back gate capacitances $Cb_{g1}$ and $Cb_{g2}$, and a series capacitance $C_{s1}$ of three slots 21, 22 and 23 can be leak paths for the high frequency component of the photocurrent. In the graphene photodetector 1 of the present embodiment, the first Si stripe 31 and the second Si stripe 32 are not subjected to impurity doping, and the resistivity is maintained at approximately $10^3$ Ωcm. This means that a resistance $R_{st}$ of megaohm (MΩ) order is inserted in series to the capacitance $C_{s1}$ of the slots, and hence, the leak of the high frequency component of the photocurrent through the parallel capacitors can be suppressed to a negligible level.

To suppress leak of the high frequency component from the n-type Si regions 33 and 34 to the other portions, the n-type Si regions 33 and 34 are formed to be sufficiently remote from the other interconnects and conductive regions.

Since graphene is a zero-gap semiconductor, electrons and holes are generated by phonon absorption, etc. even if the light is not made incident on the graphene. Since energy of the carriers generated by the phonon absorption is small and since the carriers are recombined in a shorter time than the photoexcited carriers if the applied voltage is low, the ratio at which the carriers appear to the outside as the dark current is small. However, if the applied voltage is raised, dark current $I_d$ greater than that in a semiconductor such as InGaAs is generated since the electrons and holes with low energy are also accelerated by the electric field and hardly recombined. Therefore, increasing the applied voltage to an excessive level is undesirable. In addition, to obtain a good reception characteristic, it is desirable to reduce the influence of the dark current in the receiver circuit. In a case where the dark current $I_d$ is constant and already known, when voltage $V_d = I_d R_L$ equal to a product of the dark current $I_d$ and the feedback resistance $R_L$ is applied to a non-inverting (+) input of the operational amplifier 100, instead of grounding it as in the circuit shown in FIG. 4, the output voltage $V_0 = -IpR_L$ proportional to the photocurrent can be output. If the dark current of the graphene photodetector 1 is varied due to the bias voltage, temperature variation, aging, etc., the voltage $V_d$ to be applied to the non-inverting (+) input of the operational amplifier may be feedback-controlled from a subsequent circuit such that a DC component of the output voltage $V_0$ is suppressed.

Figure 5:
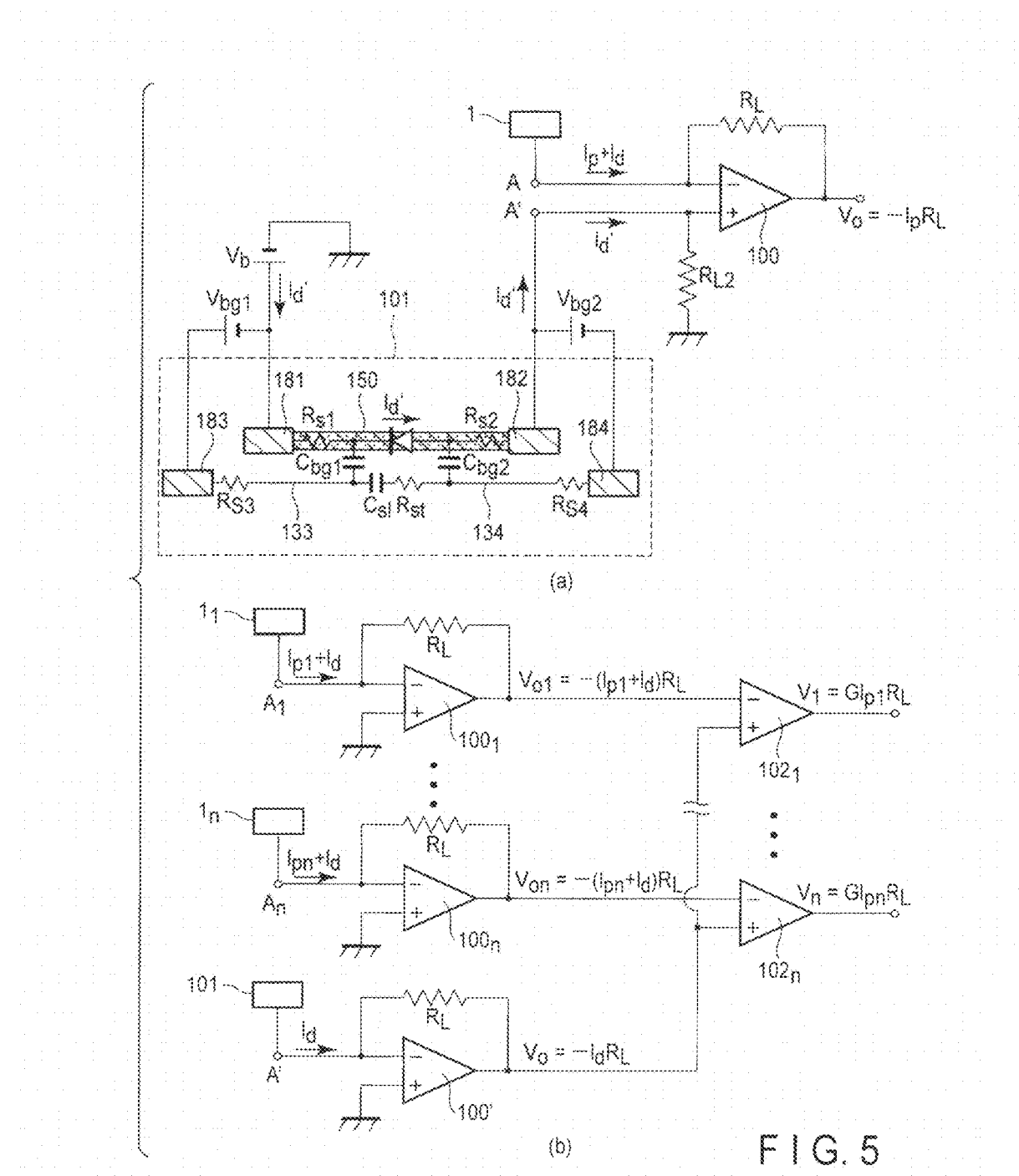
FIG. 5 is a diagram showing an example of a configuration for canceling a dark current in the graphene photodetector of the embodiment.

Alternatively, a dummy element 101 which is configured in the same manner as the graphene photodetector 1 of the embodiment and to which the light to be made incident on the graphene photodetector of the embodiment (signal light) is not input may be arranged in close vicinity of the graphene photodetector 1 and an output of the dummy element 101 may be connected to the positive input of the operational amplifier 100 and a load resistance $R_{L2}$ (=$R_L$) having an end grounded, as shown in FIG. 5(a). An output of the graphene photodetector 1 of the present embodiment (i.e., a portion corresponding to an A point shown in FIG. 4) is connected to an A point of FIG. 5(a). In the drawing, major portions of the dummy element 101 corresponding to those of the graphene photodetector 1 of the present embodiment are denoted by reference numbers obtained by adding 100 (hundred) to the reference numbers in the photodetector 1. Since the dark current $I_d$ of the graphene photodetector 1 of the present embodiment and the dark current $I_d'$ of the dummy element 101 are substantially equal to each other and $R_{L2}$ is set to be equal to $R_L$, the output voltage $V_O$ of the operational amplifier 100 is $-I p R_L$. If the values of the dark current and resistance include errors, a slight DC component remains, but the influence of the dark current can be remarkably reduced as compared with the example shown in FIG. 4.

The dummy element 101 may not have completely the same structure as the graphene photodetector 1 of the present embodiment. For example, when the dummy element 101 has a shorter length and the dark current $I_{d'}$ is 1/s of the dark current $I_d$ of the graphene photodetector 1 of the present embodiment, if $R_{L2}$ is set to be s times as large as $R_L$, the output voltage $V_O$ of the operational amplifier 100 is $-I p R_L$.

When n graphene photodetectors $\mathbf{1}_1$ to $\mathbf{1}_n$ of the present embodiment are integrated in close vicinity of each other, the dummy element 101 may be shared by n graphene photodetectors $\mathbf{1}_1$ to $\mathbf{1}_n$ as shown in FIG. 5(b). Outputs of the second electrodes of n graphene photodetectors $\mathbf{1}_1$ to $\mathbf{1}_n$ and dummy element 101 are connected to each of points $A_1$ to $A_n$ and A', and a non-inverting (+) input of each of operational amplifiers $\mathbf{100}_1$ to $\mathbf{100}_n$ and 100' is grounded. Since output voltages $V_{O1}$ to $V_{On}$ of the operational amplifiers $\mathbf{100}_1$ to $\mathbf{100}_n$ connected to the respective graphene photodetectors $\mathbf{1}_1$ to $\mathbf{1}_n$ are $-(I p_1 + I_d) R_L$ to $-(I p_n + I_d) R_L$ and since an output $V_O'$ of the operational amplifier 100' connected to the dummy element 101 is $-I_d R_L$, influences of the dark currents of the graphene photodetectors $\mathbf{1}_1$ to $\mathbf{1}_n$ can be wholly canceled by the dummy element 101 alone if subtraction is executed by differential amplifiers $\mathbf{102}_1$ to $\mathbf{102}_n$ arranged at a subsequent stage. The influence from the dark current can be reduced in various methods other than these configurations.

Besides the photocurrent generated by the above-mentioned mechanism (photovoltaic effect), a photocurrent generated by a photothermoelectric effect flows in the graphene photodetector 1 if the carrier density is low, and a photocurrent generated by bolomic effect flows if the carrier density is high and the dark current is large. Since the photocurrents generated by the photothermoelectric effect and the bolomic effect may flow in a direction of canceling the photocurrent generated by the photovoltaic effect, depending on conditions, the efficiency may be reduced.

In a graphene photodetector using p-p$^+$ junction, for example, the photocurrent generated by bolomic effect flows in a direction of reducing the photocurrent generated by the photovoltaic effect. (Since a number of holes are present at the p-p$^+$ junction, a large dark current is flowing under the voltage application. Since the temperature rise due to the light absorption causes reduction in the mobility, the dark current is reduced. This phenomenon is expressed as the photocurrent flows in an opposite direction by the bolomic effect). On the other hand, in a graphene photodetector of a type of extracting the photoexcited carriers by the electric field in the depleted region formed on a negative electrode side of the pip structure, the electron temperature near the negative electrode is raised by photoexcitation, so that the density of holes (the majority carrier) becomes higher on the negative electrode side and diffused to the positive electrode side (Seebeck effect). In other words, the photocurrent generated by the photothermoelectric effect flows in a direction of canceling the photocurrent generated by the photo-voltaic effect, which flows from the positive electrode side to the negative electrode side.

In contrast, in the graphene photodetector 1 of the present embodiment, in which a reverse bias is applied to the pin structure, the photocurrent generated by the bolomic effect is smaller than the photocurrent generated by the photovoltaic effect and is negligible since the carrier density in the i region is low. In addition, the photocurrent generated by the photothermoelectric effect and the photocurrent generated by the photovoltaic effect flow in the same direction (i.e., the holes generated in the i region in which the electron temperature becomes high is diffused to a p region on the negative electrode side and the electrons are diffused to an n region on the positive electrode side). Since the photothermoelectric effect is a phenomenon depending on the electron temperature, the response is almost as fast as that of the photovoltaic effect. According to the graphene photodetector 1 of the present embodiment, degradation of the quantum efficiency caused by the bolomic effect can be neglected and, oppositely, increase in the quantum efficiency caused by the photothermoelectric effect can be expected.

The electron temperature of the graphene photodetector 1 becomes higher than the electron temperature of the dummy element 101 by the photoexcited carriers, but the current increased by the carriers generated due to the rise in the electron temperature is the photocurrent due to the photothermoelectric effect and is not considered as the dark current. Compensating the dark current by the dummy element 101 is therefore effective even if the rise in electron temperature caused by the photoexcited carriers is considered.

In the graphene photodetector 1 of the present embodiment, the optical waveguide (slot waveguide) 90 is formed with four high-refractive-index regions 31, 32, 61 and 62 serving as rails, two of which are spaced apart by a gap on each of the upper and lower sides of the graphene film 50, a main slot is constituted by the gap (first gap) 21 between the first and second high-refractive-index regions (rails) 31 and 32 and the gap (fourth gap) 71 between the third and fourth high-refractive-index regions (rails) 61 and 62, and sub-slots are constituted by the gap (second gap) 22 between the first high-refractive-index region 31 and the first conductive semiconductor region 33 and the gap (third gap) 23 between the second high-refractive-index region 32 and the second conductive semiconductor region 34. FIGS. 6(a), 6(b), 6(c) and 6(d) show examples of comparative structures different from the graphene photodetector of the present embodiment. Each of the drawings show a peripheral portion of the optical waveguide 90 alone, and portions not shown are similar to those of the structure shown in FIG. 1. The portions corresponding to the graphene photodetector of the present embodiment are denoted by the same reference numbers, which do not indicate that the portions are equal in size.

Figure 6:
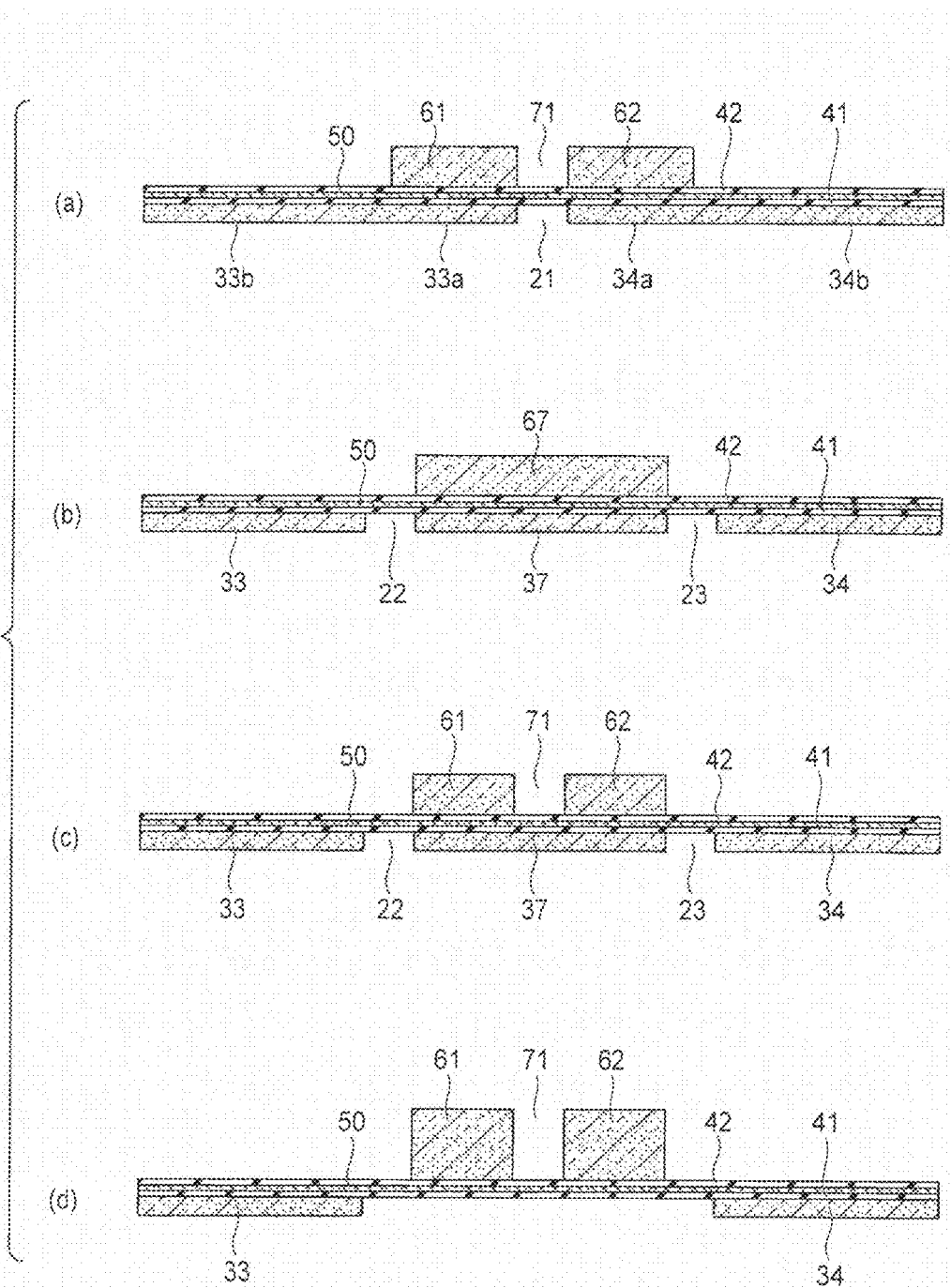
FIG. 6 is a schematic illustration showing several comparative structures to the graphene photodetector of the embodiment.

Among the Si layers under the first $Al_2O_3$ layer 41 in the graphene photodetector having the comparative structure shown in FIG. 6(a), portions 33a and 34a in close vicinity of the optical waveguide are undoped regions, while portions 33b and 34b remote from the optical waveguide are low-resistance n-type regions. When the back gate is applied from the n-type regions 33b and 34b of the lower Si layer to the graphene film 50, in the same manner as the graphene photodetector 1 of the present embodiment, no DC current flows in the Si layers, and hence, the potentials of the undoped regions 33a and 34a remain the same as those of the n-type regions 33b and 34b, respectively. Therefore, holes and electrons are induced also in the undoped regions 33a and 34a, respectively, near the border with the first Al$_2$O$_3$ layer 41, and electrons and holes, respectively, are induced in the corresponding portions of the graphene film 50 on the opposite side of the first Al$_2$O$_3$ layer 41. An intrinsic region to which a high field is applied when the voltage is applied to the electrode 81, of the graphene film 50, is the main slot portion alone. Since a sub-slot is not formed, the waveguide mode tails to portions of the lower Si layer above which the Si stripe 61 or 62 is not formed. Since most of the photoexcited carriers in the graphene other than the slot portion are substantially lost by recombination, the current extraction efficiency is lowered to an approximately half level of the photodetector of the embodiment.

In the graphene photodetector having the comparative structure shown in FIG. 6(b), the optical waveguide and the back gate portions are separated optically and electrically. However, the waveguide mode is distributed over Si stripes 37 and 67, and electrons and holes are generated in a wide range of the graphene film 50 sandwiched between the Si stripes 37 and 67. Since the electric field during a reverse bias application is comparatively low in this portion and the electrons and the holes coexist along the width of the waveguide stripes, the ratio of the carriers lost by the recombination becomes higher than the ratio of the carriers extracted as the photocurrent.

In the comparative structure shown in FIG. 6(b), the waveguide becomes a slot waveguide in the TM mode if thickness of the Si stripes 37 and 67 is increased to allow the TM mode to be guided. In this case, the Ey component of the TM mode is enhanced in the graphene film 50, but the absorption efficiency does not become much high since the graphene film 50 absorbs the only component of the electric field parallel to the film and electric field components $E_x$ and $E_z$ parallel to the film are very weak in the TM mode. In addition, the ratio of extracting the carriers generated by the light absorption as the photocurrent is low, similarly to the case in the TE mode.

The comparative structure shown in FIG. 6(c) in which the main slot is formed on the upper side or lower side alone of the graphene film 50 is also considered. In this case, improvement of the quantum efficiency at a certain level can be expected, but the electric field in the graphene film 50 just under the main slot portion 71 is weak as compared with the embodiment and the degree of improvement is not remarkable as compared with the embodiment.

In addition, the comparative structure shown in FIG. 6(d) in which the graphene film 50 is not sandwiched between the upper and lower high-refractive-index regions is also considered. In this case, since the field intensity of the TE mode is not so high in the graphene of the main slot portion 71, a high quantum efficiency as obtained from the graphene photodetector of the embodiment cannot be achieved.

In addition, even when the graphene film 50 is sandwiched by the upper and lower high-refractive-index regions 31, 32, 61 and 62, similarly to the photodetector 1 of the embodiment and when the lower high-refractive-index regions 31 and 32 or the upper high-refractive-index regions 61 and 62 are excessively thin, the field intensity of the TE mode is not so high in the portion of the graphene film 50 between the main slot portions 21 and 71. To obtain a high quantum efficiency, the thickness of thinner regions, of the high-refractive-index regions 31 and 32 arranged on the lower side of the graphene film 50 and the high-refractive-index regions 61 and 62 arranged on the upper side of the graphene film 50 should preferably be set to be greater than or equal to 20% of the total thickness of the upper and lower high-refractive-index regions 31, 32, 61 and 62.

According to the graphene photodetector 1 of the present embodiment, the quantum efficiency can be remarkably improved as compared with the graphene photodetector of the above-explained comparative structures, since overlap of the TE mode and the portion of the graphene film at which the electric field is high is improved and the current extraction efficiency is also improved.

In the graphene photodetector 1 of the present embodiment, it may be difficult to fit the positions and widths of the upper Si stripes (rails) perfectly to those of the lower Si strips, since the third and fourth Si stripes 61 and 62 are formed in different process steps from those of the first and second Si stripes 31 and 32.

Figure 7:
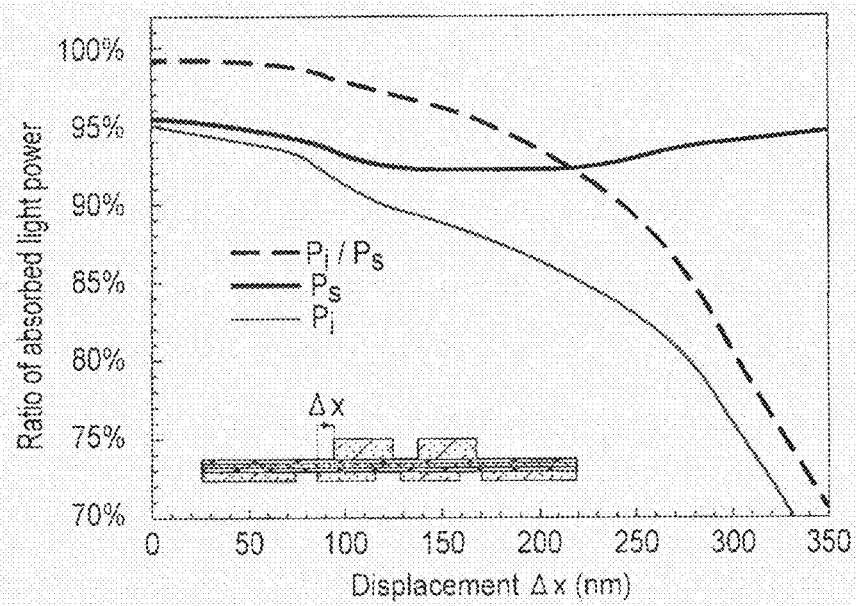
FIG. 7 is a graph showing an influence of pattern displacement Δx between upper and lower Si layers on an absorbed light power.

FIG. 7 is a graph showing a total light power Ps (thick solid line) absorbed by the graphene photodetector 1 of the embodiment having a device length of 50 μm, a light power Pi (narrow solid line) absorbed in the intrinsic region, and a ratio Pi/Ps (broken line), where the incident light power is 1, in a case where the pattern of the a-Si stripes 61 and 62 above the graphene film 50 is displaced by Δx from the pattern of the Si layers 31 and 32 below the graphene film 50, in the graphene photodetector 1 to which specific materials and numerical values exemplified in the above explanations are applied. If the displacement Δx is smaller than or equal to 75 nm, the quantum efficiency is hardly deteriorated since 99% of the total absorption light power are absorbed in the intrinsic region. If the displacement Δx exceeds 75 nm, the ratio of the light absorbed in the intrinsic region is remarkably lowered but, even if the displacement is 175 nm, 95% of the total absorption light power are absorbed in the intrinsic region and the quantum efficiency is deteriorated by only 5%.

Thus, the properties are not remarkably deteriorated even if small displacement occurs within a range of error which may be made in a standard CMOS process. Therefore, in the graphene photodetector 1 of the present embodiment, ranges of x coordinates occupied by the first high-refractive-index region 31 and the third high-refractive-index region 61 do not need to completely match, and ranges of x coordinates occupied by the second high-refractive-index region 32 and the fourth high-refractive-index region 33 do not need to completely match. To suppress deterioration of the properties, however, the displacement Δx should preferably be smaller than or equal to 75% of the slot width, i.e., the width of the portion in which the lower high-refractive-index region gap (first gap) 21 and the upper high-refractive-index region gap (fourth gap) 71 overlap each other across the graphene film 50 should preferably be secured at more than or equal to 25% of the width of the upper high-refractive-index region gap (fourth gap) 71.

The present embodiment can be variously modified and applied without departing from the spirit of the invention.

The graphene photodetector 1 to which the specific materials and numerical values exemplified in the above explanations are applied is designed in consideration of tolerance of the displacement. If the process accuracy is high and the displacement is not serious, the carrier transit time can be reduced by reducing the stripe width and the slot width, and the quantum efficiency can be further improved. In case the distribution of the TE-mode in the conductive semiconductor regions 33 and 34 is increased by reducing the widths, the third Si stripe 61 and the fourth Si stripe 62 may be set to be slightly thicker.

In the above-explained embodiment, each of the first conductive semiconductor region 33 and the second conductive semiconductor region 34 is in the n type, but both may be in the n type, p type, or in a combination of the n type and the p type.

Although the positive bias voltage is applied to the first electrode 81 and the second electrode 82 is virtually grounded in the above-mentioned embodiment, oppositely, the first electrode 81 may be virtually grounded and the negative bias voltage may be applied to the second electrode 82.

The graphene film 50 is formed by growing up on the Cu foil by CVD, but the method of forming the graphene film 50 is not limited to this and the graphene film 50 may be formed in any other methods.

In addition, if a bilayer graphene film is used instead of the monolayer graphene film 50, the absorption coefficient per length is substantially doubled, and the device length can be reduced and the quantum efficiency can be increased. In this case, raising the back gate voltage is desirable to make the two layers of the graphene film 50 low-resistant. The graphene film 50 may be further multi-layered within a range in which the back gate is appropriately applied and it functions as a pin photodiode.

Figure 8:
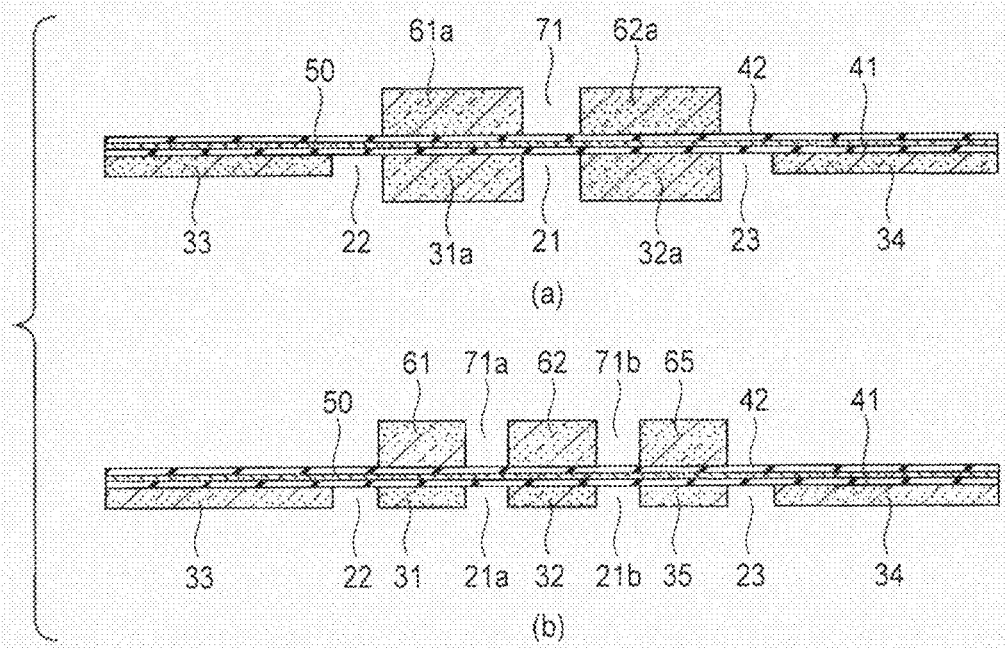
FIG. 8 is a schematic illustration showing modifications of the graphene photodetector of the embodiment.

In the above-mentioned embodiment, the portion under the first $Al_2O_3$ film 41 is structured so as to process utilizing the SOI substrate. If the first high-refractive-index region 31 and the second high-refractive-index region 32 are formed of amorphous silicon (a-Si) and the first conductive semiconductor region 33 and the second conductive semiconductor region 34 are formed of p-type polysilicon, the device can be fabricated in a back end process without using an expensive SOI substrate. In this case, the thickness of the first high-refractive-index region 31 and the second high-refractive-index region 32 does not need to be equal to the thickness of the conductive Si regions 33 and 34. As shown in FIG. 8(a), if the thickness of a first high-refractive-index region 31a and a second high-refractive-index region 32a is set to be substantially equal to the thickness of a third high-refractive-index region 61a and a fourth high-refractive-index region 61b, the graphene film 50 can be arranged in a region in which the optical field intensity is highest in the slot, and further reduction of the device length or improvement of the quantum efficiency can be achieved.

The first to fourth high-refractive-index regions (rails) 31a, 32a, 61a and 62a do not need to be semiconductors and may be insulators (for example, Si-rich $SiN_x$, etc.) having a sufficiently higher refractive index than a peripheral clad ($SiO_2$) and having a small light absorption loss. Since the refractive index is low as compared with Si, an effect of concentrating the optical field to the slot portion becomes weak and the cross-sectional area of the optical waveguide is enlarged. However, since the electric field in the graphene film 50 is not lowered at a portion sandwiched by the high-refractive-index regions 31a, 32a, 61a and 62a, lowering of the carrier running speed at this portion can be avoided. If a high-k material (such as $HfO_2$ and $ZrO_2$) having a large relative dielectric constant $\in_r$ is used for the high-refractive-index regions 31a, 32a, 61a and 62a, the electric field of the region sandwiched by the high-refractive-index regions 31a, 32a, 61a and 62a in the graphene film 50 can be enhanced.

Alternatively, as shown in FIG. 8(b), a gap between Si stripes 32 and 62 and the second conductive semiconductor region 34 on the right side may be widened, and a fifth Si stripe 35 and a sixth Si stripe 65 may be added in the gap to increase the number of main slots to two or more. In the graphene photodetector shown in FIG. 8(b) including two main slots, the quantum efficiency for the fundamental TE mode is substantially the same as the graphene photodetector 1 of the embodiment.

The material of a first insulating film 20 and a fourth insulator 70 is not limited to $SiO_2$, but a portion or all portions thereof may be the other materials (such as SiON and polyimide) that function as low-loss clads.

In addition, in the explanations of the photodetector 1 of the embodiment, the widths of the first gap 21, the second gap 22 and the third gap 23 are equal to each other. The widths of the first gap 21, the second gap 22 and the third gap 23 do not need to be equal to each other.

The third insulating film 41 and the fourth insulating film 42 are not limited to $Al_2O_3$ films, but may be other dielectric films (formed of SiN films, h-BN films, high-k material, etc.). However, a material which induces the carriers to the graphene or makes the carriers instable is not preferable. For example, in a conventional graphene photodetector formed on an $SiO_2$ film, the graphene is often in the $p^+$-type. It is also known that if an $SiO_2$ film having a hydrophilic surface is used, the Fermi level of the graphene film can be easily varied by an OH group, etc., on an interface.

The light propagating through the optical waveguide of the photodetector 1 does not need to be in the single mode. This is because light of any mode can be absorbed and extracted as the photocurrent, with a device length which enables most of mode light having the smallest absorption coefficient to be absorbed. To maintain the device length as short as possible, however, the number and position of slots should be designed so as to make a difference in absorption coefficients among the modes small.

Thus, the graphene photodetector 1 of the present embodiment can solve the problem of the conventional graphene photodetector that the efficiency of extracting the photocurrent is low, and provide a graphene photodetector having excellent properties such as a small size, a high efficiency, a high speed and a wide wavelength band.

The graphene optical modulator of the embodiment will be hereinafter explained.

Figure 9:
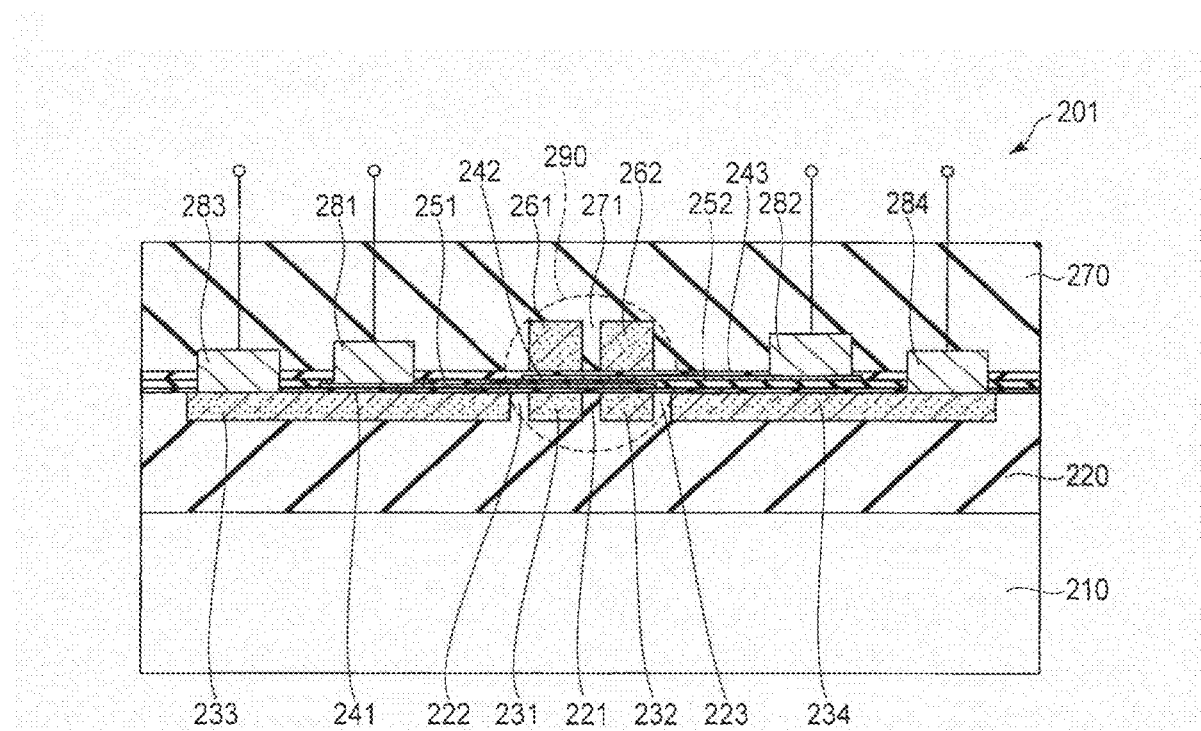
FIG. 9 is a schematic cross-sectional view showing a graphene optical modulator of an embodiment.

FIG. 9 is a schematic cross-sectional view showing a graphene optical modulator 201 of the embodiment.

Portions corresponding or similar to those of the graphene photodetector 1 of the embodiment are denoted by reference numbers obtained by adding 200 (two hundreds) to the reference numbers in the photodetector 1.

A graphene optical modulator 201 of the present embodiment comprises an Si substrate 210. A first $SiO_2$ layer (first insulating film) 220 is disposed on the Si substrate 210. A first Si stripe (first high-refractive-index region) 231 and a second Si stripe (second high-refractive-index region) 232 are disposed and spaced apart with a first gap 221, and a first n-type Si region (first conductive semiconductor region) 233 and a second n-type Si region (second conductive semiconductor region) 234 are arranged on left and right outer sides of the first Si stripe 231 and the second Si stripe 232 and spaced apart with a second gap 222 and a third gap 223, in a surface region of the first $SiO_2$ layer 220. The first Si stripe 31, the second Si stripe 32, the first n-type Si region 33 and the second n-type Si region 34 are extended in the same length in a direction perpendicular to a sheet of FIG. 9. A first $Al_2O_3$ film (second insulating film) 241 is disposed to include surfaces of the structures 231 to 234 and cover the surface of the first $SiO_2$ layer 220. A first graphene film 251 is disposed on the first $Al_2O_3$ film 241. The first graphene film 251 is disposed to be extended over at least the first gap 221 and the second gap 222. A second $Al_2O_3$ film (third insulating film) 242 is disposed to cover the first graphene film 251 and to extend on the first Al$_2$O$_3$ film 241. A second graphene film 252 is disposed on the second Al$_2$O$_3$ film 242. The second graphene film 252 is disposed to extend over at least the first gap 221 and the third gap 223. A third Al$_2$O$_3$ film (fifth insulating film) 243 is disposed to cover the second graphene film 252 and the second Al$_2$O$_3$ film 242. A third Si stripe (third high-refractive-index region) 261 and a fourth Si stripe (fourth high-refractive-index region) 262 are disposed at positions corresponding to the first Si stripe 231 and the second Si stripe 232, respectively, on the third Al$_2$O$_3$ film 243. A second SiO$_2$ layer (fourth insulating film) 270 is disposed on the third Al$_2$O$_3$ film 243 to cover the third Si stripe 261 and the fourth Si stripe 262. Each of the first to fourth Si stripes 231, 232, 261 and 262 has a refractive index higher than the indexes of the first SiO$_2$ layer 220 and the second SiO$_2$ layer 270. A first electrode 281 is disposed on the first graphene film 251 on the opposite side of the third Si stripe 261 from the fourth Si stripe 262, to electrically contact with the first graphene film 251. A second electrode 282 is disposed on the second graphene film 252 on the opposite side of the fourth Si stripe 262 from the third Si stripe 261, to electrically contact with the second graphene film 252. In addition, a third electrode 283 and a fourth electrode 284 in electric contact with the first conductive Si region 233 and the second conductive Si region 234 are also disposed.

The first Si stripe 231, the second Si stripe 232, the first n-type Si region 233 and the second n-type Si region 234 can be formed to have the same thickness of, for example, 50 nm. In addition, a thickness of the first SiO$_2$ layer from lower surfaces of the regions 231 to 234 to the Si substrate 210 can be set to be, for example, 2 μm. The first Si stripe 231 and the second Si stripe 232 are not subjected to doping on purpose, and the stripe width can be set at, for example, 225 nm. The first n-type Si region 233 and the second n-type Si region 234 become in the n type by, for example, phosphorous (P) ion implantation and annealing.

Examples of a method of forming the Si stripe 231, the Si stripe 232, the n-type Si region 233 and the n-type Si region 234 include etching the top Si layer of the SOI substrate, except portions which are to be Si stripe 231, the Si stripe 232, the n-type Si region 233 and the n-type Si region 234, exposing the surface of the BOX layer of the SOI substrate; burying these structures with an SiO$_2$ layer; and flattening the Si stripe 231, the Si stripe 232, the n-type Si region 233 and the n-type Si region 234 by CMP such that the Si stripe 231, the Si stripe 232, the n-type Si region 233 and the n-type Si region 234 have a predetermined thickness.

Alternatively, the Si stripe 231, the Si stripe 232, the n-type Si region 233 and the n-type Si region 234 can be formed by forming the SiO$_2$ layer 220 on the substrate 210, and forming and patterning an n-type poly-Si layer on the SiO$_2$ layer to form the n-type Si region 233 and the n-type Si region 234. Then, burying the n-type Si region 233 and the n-type Si region 234 with the SiO$_2$ layer; flattening the SiO$_2$ layer by CMP; forming trenches at portions where the Si stripe 231 and the Si stripe 232 are to be formed; burying the trenches with a-Si; and flattening the Si stripe 231, the Si stripe 232, the n-type Si region 233 and the n-type Si region 234 by CMP such that they have a predetermined thickness.

The gap (first gap) 221 formed between the first Si stripe 231 and the second Si stripe 232 can be formed to have a width of, for example, 100 nm. In the embodiment shown in FIG. 9, the first gap 221, the second gap 222, and the third gap 223 are filled with SiO$_2$. However, the first gap 221, the second gap 222, and the third gap 223 do not need to be necessarily filled with SiO$_2$ (first insulating film) but some or all parts of the gaps may be replaced with the other materials having a small refractive index and giving no bad influence to light propagation, vacuum, etc. In addition, for example, space may be formed in SiO$_2$ (first insulating film) in the first gap 221, the second gap 222, and the third gap 223.

The graphene film can be formed in the method as the graphene photodetector 1 of the embodiment.

The gap (second gap) 222 formed between the first Si stripe 231 and the first n-type Si region 233 and the gap (third gap) 223 formed between the second Si stripe 232 and the second n-type Si region 234 have equal widths, which can be set at, for example, 125 nm.

The thicknesses of the first Al$_2$O$_3$ film 241, the second Al$_2$O$_3$ film 242 and the third Al$_2$O$_3$ film 243 can be set at, for example, 5 nm, 2 nm and 5 nm, respectively.

The first graphene film 251 and the second graphene film 252 can be formed by transferring single-crystal monolayer graphene grown by CVD on Cu foil which has a surface flattened by polishing and high-pressure annealing, on the first Al$_2$O$_3$ film 241 and the second Al$_2$O$_3$ film 242, respectively.

In the first graphene film 251 and the second graphene film 252, the Fermi level is adjusted to be close to the Dirac point by removing adsorbed particles by processing such as annealing, after transferring and patterning, and, for example, the mobility can be set at $2\times10^5$ cm$^2$V$^{-1}$s$^{-1}$ and the sheet resistance can be set at 2.5 kΩ/□ in a state of applying no voltage. The first graphene film 251 and the second graphene film 252 are formed by growing up on the Cu foil by CVD, but the method of forming the graphene films is not limited to this and the graphene films may be formed in any other methods.

The third Si stripe 261 and the fourth Si stripe 262 can be formed by processing undoped amorphous silicon (a-Si) deposited on the third Al$_2$O$_3$ film 243, in a stripe shape, such that the amorphous silicon is located at portions which correspond to the first Si stripe 231 and the second Si stripe 232, respectively. The third Si stripe 261 and the fourth Si stripe 262 can be formed to have, for example, a thickness of 150 nm and a stripe width of 225 nm. The gap 271 between the third Si stripe 261 and the fourth Si stripe 262 can be formed to have a width of, for example, 100 nm and is buried with the second SiO$_2$ layer 270.

The first electrode 281 may be formed of Ti/Au while the second electrode 282 may be formed of Au. The graphene film 251 under the first electrode of Ti/Au is in the n type and the graphene film 252 under the second electrode of Au is in the p type due to charge transfer between metal and graphene. The first electrode 281 and the second electrode 282 can be disposed on the first graphene film 251 and the second graphene film 252, respectively, in a method such as lift-off.

The third electrode 283 and the fourth electrode 284 may be formed of, for example, nickel silicide. A width of an interval between the third Si stripe 261 and the first electrode 281 and a width of an interval between the fourth Si stripe 262 and the second electrode 282 can be set at, for example, 800 nm. The widths may be maintained such that the electrodes do not give a bad influence to an electromagnetic component of the light propagating an optical waveguide 290 to be explained later.

The graphene optical modulator 201 to which the concrete materials and numerical values exemplified in the above-explained embodiment are applied is designed for intensity modulation of the incident light having a wavelength band of 1.31 μm but, if the applied voltage is adjusted, the optical modulator can be used for modulation of a comparatively wide wavelength range, within a range in which the optical waveguide meets single-mode conditions. The optical modulator can also be optimized for use with the other wavelength by varying the size of each of the portions of the waveguide. The first to fourth Si stripes (rails) 231, 232, 261 and 262, portions sandwiched by the Si stripes, and the structures close to the portions form the single-TE mode optical waveguide (slot waveguide) 290. The optical waveguide is slightly different from the graphene photodetector of the embodiment in waveguide structure, but an electric field component $E_x$ parallel to the substrate of the fundamental TE mode light having a wavelength of 1.31 μm that propagates the slot waveguide 290 has a mode profile similar to that in FIG. 2.

The length of the graphene optical modulator 201 of the present embodiment, i.e., the length of the first graphene film 251 and the second graphene film 252 extended in a direction perpendicular to the sheet of FIG. 9 can be set at, for example, 30 μm.

The graphene optical modulator 201 of the present embodiment can be connected to Si-channel waveguides via mode converters disposed before and after the optical modulator and can be integrated with the other optical elements.

The first graphene film 251 and the second graphene film 252 are layered at the optical waveguide portion 290. The first graphene film 251, the second graphene film 252, and the second $Al_2O_3$ film 242 sandwiched between the graphene films constitute a capacitor $C_m$ (hereinafter called a graphene capacitor). The area of the graphene capacitor can be set at, for example, 30 μm×0.6 μm=18 μm². If the voltage V is applied to the graphene capacitor, electric charges of reverse polarity are induced to the first graphene film 251 and the second graphene film 252, and the Fermi level of the graphene is varied. The incident light having a wavelength λ of 1.31 μm with a photon energy hν=0.947 eV where h is a Planck's constant, ν is c/λ, i.e., a frequency of light, and c is a speed of light in vacuum, is absorbed by the graphene if the absolute value of the Fermi level $E_F$ is somewhat smaller than hν/2 (0.473 eV) but is transmitted if the absolute value of $E_F$ is somewhat greater than hν/2. A voltage region between them is a transition region ($E_F$ hν/2), where the absorption coefficient varies depending on Fermi distribution of the graphene at room temperature.

Figure 10:
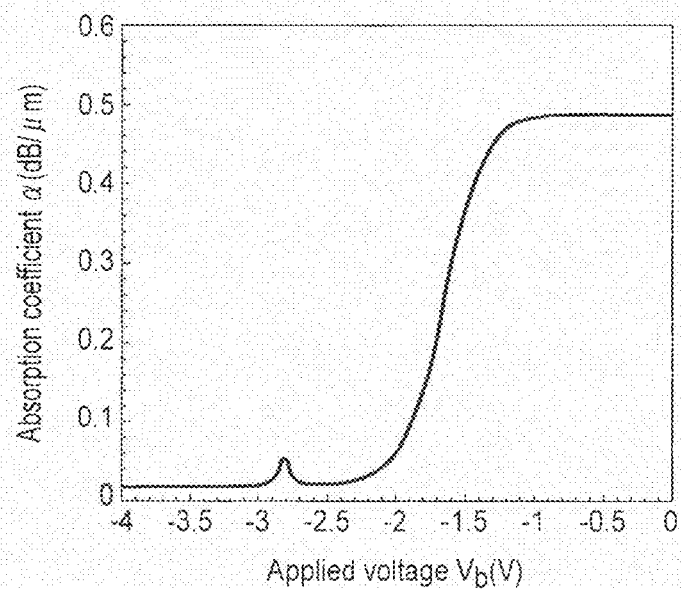
FIG. 10 is a graph showing an applied voltage dependence of an absorption coefficient in the graphene optical modulator of the embodiment.

FIG. 10 is a graph showing dependence of an absorption coefficient of the optical waveguide 290 on the voltage applied to the graphene capacitor. Since the graphene films 251 and 252 used for the graphene optical modulator 201 of the present embodiment are undoped, they show substantially the same properties even if the voltage polarity is inverted. If the applied voltage |V| to the graphene capacitor is equal to or lower than 1V, the absorption coefficient is 0.48 dB/μm, which causes absorption of 14.4 dB for a propagation length of 30 μm. If |V| is equal to or greater than 2.5V, the absorption coefficient is 0.02 dB/μm, corresponding to a loss of 0.6 dB for a propagation length of 30 μm. In other words, if a central bias voltage and modulation amplitude are set at ±1.75V and ±0.75V, respectively, optical modulation can be executed with an insertion loss of 0.6 dB and an extinction ratio of 13.8 dB.

A small peak related to plasma oscillation in the graphene appears in vicinity of |V|=2.8V but will not be a serious problem since the absorption is weaker as compared with the inter-band absorption and the voltage range is restricted. If a high extinction ratio is required, the voltage on the transparent side may be set at the outside of this region.

The absorption peak caused by plasma resonance results from collective oscillation (surface plasmon) of electric charges in the graphene films 251 and 252. If a real part of the relative dielectric constant, a refractive index, and an extinction coefficient, for an electric field component parallel to the surfaces of the graphene films 251 and 252, are represented by Re[∈$_{r//}$], n$_{//}$, and k$_{//}$, respectively, resonance absorption occurs under a condition that Re[∈$_{r//}$]=n$_{//}^2$−k$_{//}^2$≈0. This condition depends on the carrier density of the graphene, and a strong and sharp absorption peak is not formed if variation in the Fermi level in the graphene films 251 and 252 is not negligible. In general, this absorption peak contributes only to the TM-mode absorption having an electric field component Ey vertical to the graphene films 251 and 252. However, when the Ey component of the TE waveguide mode is present in the graphene films 251 and 252, as in a vertically asymmetric three-dimensional waveguide, absorption occurs to some extent.

Figure 11:
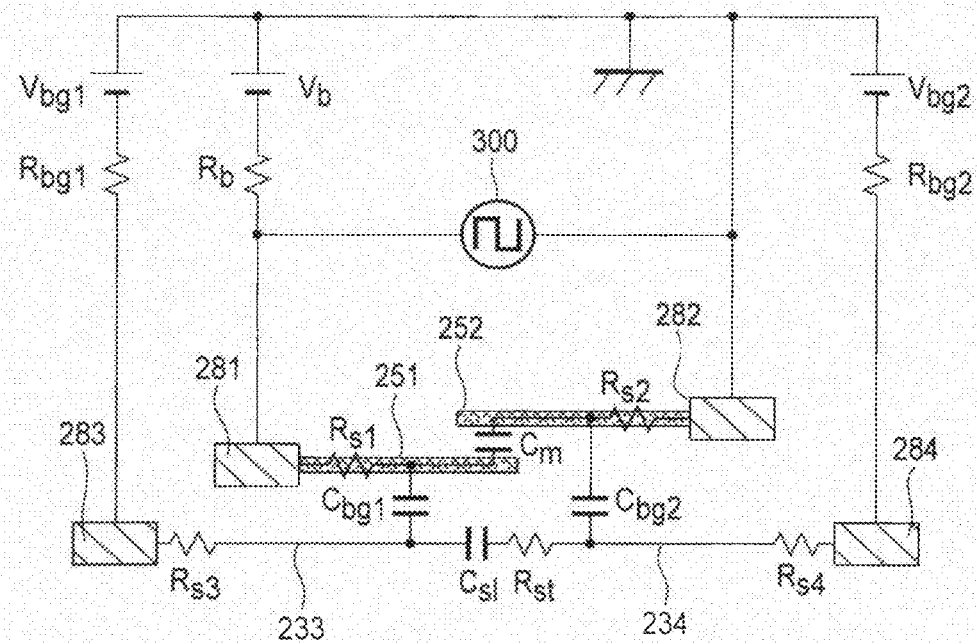
FIG. 11 is a diagram showing an equivalent circuit of the graphene optical modulator of the embodiment, and an example of an external circuit connected thereto.

FIG. 11 is a diagram for explanation of an example of an equivalent circuit of the graphene optical modulator 201 of the present embodiment, and an example of an external circuit connected to the graphene optical modulator of the present embodiment via the electrodes 281, 282, 283 and 284. Since the device length of the graphene optical modulator 201 of the present embodiment is short, it can be treated as a lumped element if the driving circuit is integrated in close vicinity of the modulator.

The second electrode 282 is grounded, and DC biases of voltages $V_b$ (=−1.75V), $Vb_{g1}$ (=−0.75V) and $Vb_{g2}$ (=−1.4V) are applied to the first electrode 281, the third electrode 283 and the fourth electrode 284, respectively. Series resistances $R_b$, $R_{bg1}$ and $R_{bg2}$ are inserted to suppress high-frequency currents. A high-speed modulation signal having an amplitude of 1.5 Vpp is applied from a driving circuit 300 to the first electrode 281. Leakage of the high-speed modulation signal through the back gate capacitances $C_{bg1}$ and $Cb_{g2}$ and the serial capacitance $C_{s1}$ of the slot waveguide is suppressed to a negligible level by a series resistance $R_{sr}$ of Si stripes 231, 232, 261 and 262 with high resistivity.

Since the sheet resistance of the undoped graphene is 2.5 kΩ/□, the resistance of the wiring region having a length of 800 nm and a width of 30 μm from the first electrode 281 and the second electrode 282 to the graphene capacitor is 670 in a state in which the back gate voltage is not applied. Supposing that the contact resistance of each electrode is 30, each of the series resistances $R_{s1}$ and $R_{s2}$ is 700. A capacitance $C_m$ of the graphene capacitor is formed of a series connection of the capacitance (0.68 pF) of the second $Al_2O_3$ film 243 and the quantum capacitances of the first graphene film 251 and the second graphene film 252. The quantum capacitance of each of the first graphene film 251 and the second graphene film 252 depends on the voltage, and is 1.40 pF if |V| is 1V and 2.67 pF if |V| is 2.5V. The quantum capacitance is 2.09 pF when the bias voltage |V| is 1.75V, and RC time constant is estimated at 57 ps, based on the capacitance $C_m$ of the graphene capacitor, which is 0.41 pF at this time. Since the cutoff frequency f is 1/(2πRC)=2.77 GHz, the upper limit of the bit rate for non-return-to-zero (NRZ) signal is approximately 4 Gbps.

In the graphene optical modulator 201 of the present embodiment, if the bias voltage of, for example, −1.75V is applied to the first graphene film 251 side, electrons of approximately 1.79×10$^{13}$ cm$^{−2}$ are induced to the first graphene film 251 and holes of approximately the same level are induced to the second graphene film 252 in the graphene capacitor, and the Fermi level becomes approximately ±0.49 eV. When the applied voltage is modulated between −1V and −2.5V, the carrier density of the graphene capacitor is modulated between $0.8 \times 10^{-3}$ cm$^{-2}$ and $2.9 \times 10^{13}$ cm$^{-2}$, and the Fermi level is modulated between ±0.34 eV and ±0.63 eV.

In the graphene optical modulator 201 of the present embodiment, unlike the graphene photodetector 1 of the embodiment, the polarity of the carriers induced in graphene in the wiring region is arbitrary, as long as its resistance in the equivalent circuit is low. However, if its polarity is the same as that of the carriers induced in the graphene capacitor, discontinuity of the potential is small and the carriers can be charged and discharged smoothly. The back gate voltage can be set such that, for example, electrons of approximately $4.5 \times 10^{12}$ cm$^{-2}$ are induced in the wiring region of the first graphene film 251 and holes of approximately $4.5 \times 10^{12}$ cm$^{-2}$ are induced in the wiring region of the second graphene film 252. The sheet resistance in the wiring region is lowered to 250Ω/□ and each of the series resistances $R_{s1}$ and $R_{s2}$ in the wiring region is reduced to 100. RC time constant becomes 8.2 ps, and the cutoff frequency is improved to 19.4 GHz. As a result, the NRZ modulation of 25 Gbps can be achieved. The sheet resistance can be further lowered by increasing the back gate voltage, but the rate of the reduction in sheet resistance to the increase in voltage becomes lower as the voltage is increased.

When polycrystalline graphene including crystalline grain boundaries and crystal defects is used as the first graphene film 251 and the second graphene film 252, the sheet resistance of the wiring region is not sufficiently low and the response speed is lowered. Therefore, to make good use of characteristics of the graphene optical modulator 201 of the present embodiment, the graphene films 251 and 252 should desirably be single-crystal graphene.

If faster modulation is desired, the thickness of the second Al$_2$O$_3$ film 242 may be increased and the capacitance $C_m$ of the graphene capacitor may be reduced. For example, if the thickness of the second Al$_2$O$_3$ film 242 is set at 5 nm, the cutoff frequency is substantially doubled and NRZ modulation of 50 Gbps can be realized. If the quality of the Al$_2$O$_3$ film 242 is inferior, if a leakage current flows through the 2-nm thick Al$_2$O$_3$ film 242, or if the breakdown voltage of the Al$_2$O$_3$ film 242 is not high enough, the Al$_2$O$_3$ film 242 should be set to be much thicker. When the insulating film thickness of the graphene capacitor is increased, the bias voltage and the modulation voltage also need to be raised. If a material having a larger dielectric constant is utilized for the insulating film 242 of the graphene capacitor, the thickness of the insulating film 242 can be increased without serious influence on the modulation voltage and the response speed.

In the graphene optical modulator 201 of the present embodiment, the slot waveguide 290 is formed with four high-refractive-index regions 231, 232, 261 and 262 serving as rails, two of which are spaced apart by a gap on each of the upper and lower sides of the graphene capacitor, a main slot is constituted by the gap (first gap) 221 between the first and second high-refractive-index regions 231 and 232 and the gap (fourth gap) 271 between the third and fourth high-refractive-index regions 261 and 262, and sub-slots are constituted by the gap (second gap) 222 between the first high-refractive-index region 231 and the first conductive semiconductor region 233 and the gap (third gap) 223 between the second high-refractive-index region 232 and the second conductive semiconductor region 234. Similarly to the graphene photodetector 1 of the embodiment, properties of the graphene can be sufficiently used from this structure. For example, in a conventional graphene optical modulator in which the graphene capacitor is integrated on the surface of the silicon waveguide, a high extinction ratio has been hardly attained for TE-mode light. In contrast, the TE mode light can be modulated with a sufficiently high extinction ratio by using the graphene optical modulator 201 of the present embodiment with a length of several tens of micrometers.

The graphene optical modulator of the comparative structure in which the graphene film 50 in FIGS. 6(a), 6(b) and 6(d) is replaced with the first graphene film 251, the second graphene film 252, and the insulating film 242 sandwiched therebetween (graphene capacitor) will be explained hereinafter in brief. In the comparative structure comprising no sub-slots which is similar to the structure shown in FIG. 6(a), the modulation can be executed by the only main slot portion and a high modulation efficiency cannot be obtained since the back gate is applied to the graphene films 251 and 252 other than the main slot portion. In the comparative structure comprising no main slot which is similar to the structure shown in FIG. 6(b), the device length needs to be approximately 1.7 times as long as that of the graphene optical modulator 201 of the present embodiment, to obtain properties comparable to those of the optical modulator of the present embodiment. In the comparative structure similar to the structure shown in FIG. 6(d), an extinction ratio comparable to that in the optical modulator 201 of the present embodiment cannot be achieved without increasing the device length to approximately 50 μm since the optical field and the graphene films 251 and 252 do not overlap well. In contrast, in the graphene optical modulator 201 of the present embodiment, modulation with a sufficiently high extinction ratio (>10 dB) can be executed with a short device length (up to 30 μm) since interaction between the TE mode and the graphene film is greatly improved.

In the comparative structure similar to the structure shown in FIG. 6(d), when the high-refractive-index regions 261 and 262 are set to be slightly thicker so as to allow propagation of the TM mode light, the inter-band absorption of the same order as that in the TE mode light occurs in the TM mode light, too. This is because, in the TM mode light, an $E_z$ component is present near uppermost surfaces and lowermost surfaces of the Si stripes 261 and 262 and an Ex component is present near the corners of the Si stripes 261 and 262. In a conventional graphene optical modulator comprising no slot 71 and having the graphene film disposed on the Si waveguide core, the TE-mode inter-band absorption is weaker than the TM-mode inter-band absorption since the $E_x$ component of the TE mode in the graphene film is smaller than the $E_x$ component and the $E_z$ component of the TM mode in the graphene film.

In the graphene optical modulator 201 of the present embodiment, similarly to the graphene photodetector 1 of the embodiment, an alignment error and an error in stripe (rail) width which may occur in a standard CMOS process are permissible.

Figure 12:
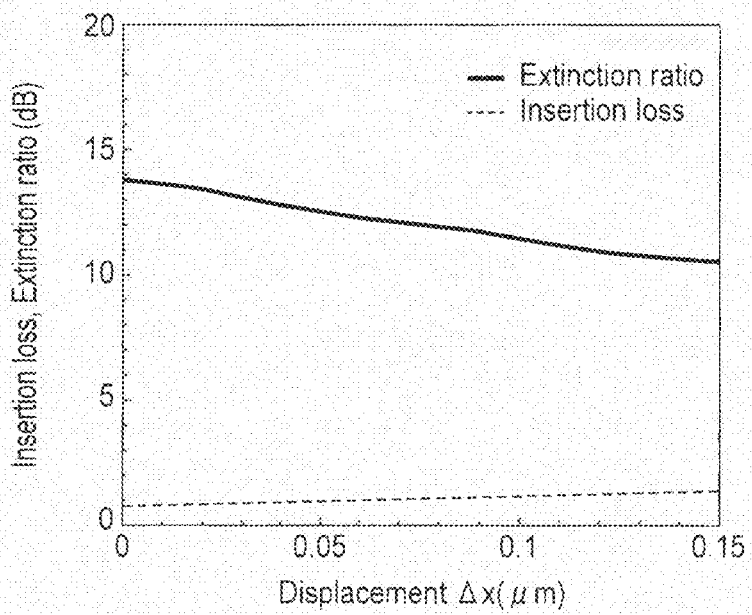
FIG. 12 is a graph showing an influence of pattern displacement Δx between upper and lower Si layers on an extinction ratio and an insertion loss.

FIG. 12 is a graph showing an influence of lateral displacement of the Si layer on the extinction ratio and the insertion loss, in the graphene optical modulator 201 to which the specific materials and numerical values exemplified in the above explanations are applied. Reduction in the extinction ratio and the increase in insertion loss which are caused by the displacement are moderate. If the displacement is within, for example, 70 nm, the extinction ratio can be maintained at higher than 12 dB and the insertion loss can be maintained at lower than 1 dB.

The numerical values described in the above explanations are those in a case where fluctuation of the Fermi level in the graphene is negligible. If the graphene film includes wrinkles, polycrystalline grain boundaries, defects, impurities, adsorbed molecules, etc., the Fermi level is fluctuated in the graphene film, serious blur occurs in the absorption curve, resulting in lowering of the extinction ratio, increase in insertion loss, increase in modulation voltage, etc. In addition, in the wiring regions between the graphene capacitor and the electrodes, the fluctuation causes lowering of the mobility, increase in resistance and lowering of the operation speed. For manufacturing of the optical modulator 201 of the present embodiment, a high-quality undoped single-crystal graphene film should desirably be used, and attention should desirably be paid to fabrication process to reduce wrinkles, defects, impurities, adsorbed molecules, etc., as much as possible. If a small fluctuation of the Fermi level remains in spite of such attention, the modulation voltage amplitude should be somewhat higher and the device length should be somewhat longer. Even in such a case, the optical modulator 201 of the present embodiment can provide higher-speed modulation at a higher extinction ratio with a shorter device length, as compared with the conventional optical modulator.

Detailed descriptions are omitted to avoid duplication of explanations, but the graphene optical modulator 201 of the present embodiment can be variously modified and applied as required, without departing from the spirit of the invention, similarly to the graphene photodetector 1 of the embodiment. As shown in, for example, FIG. 13(a), the first high-refractive-index region 231a, the second high-refractive-index region 232a, the third high-refractive-index region 261a, and the fourth high-refractive-index region 262a may be formed of amorphous silicon or an insulator, and the first conductive semiconductor region 233 and the second conductive semiconductor region 234 may be formed of polysilicon. As shown in FIG. 13(b), a plurality of main slots may be formed by adding a fifth high-refractive-index region 235 and a sixth high-refractive-index region 265. FIG. 13 shows only main portions in the vicinity of the optical waveguide 290, and the portions corresponding to those shown in FIG. 9 are denoted by the same reference numbers. However, the same reference numbers do not indicate that the portions are equal in size.

If the first high-refractive-index region 231a and the second high-refractive-index region 232a are formed of amorphous silicon, they need to be manufactured in a process different from that of the first conductive semiconductor region 233 and the second conductive semiconductor region 234, and the thickness $h_{lower\ Si}$ of the first high-refractive-index region 231a and the second high-refractive-index region 232a can be made different from the thickness (50 nm) of the first conductive semiconductor region 233 and the second conductive semiconductor region 234.

FIG. 14 shows the extinction ratio and the insertion loss as functions of the thickness $h_{upper\ Si}$ of the third and the fourth high-refractive-index regions 261a and 262a. Here, the device length L is assumed to be 30 µm, and the sum of $h_{upper\ Si}$ and thickness $h_{lower\ Si}$ of the first and the second high-refractive-index regions 231a and 232a is fixed at 200 nm, and the applied voltage $V_b$ is assumed to be switched between −1.0V and −2.5V. For example, if the thickness $h_{lower\ Si}$ is equal to the thickness $h_{upper\ Si}$ and is 100 nm, the extinction ratio is as high as 15.7 dB. Even if the device length is reduced to 26 µm, an extinction ratio of 13.1 dB and an insertion loss of 0.59 dB can be achieved.

Figure 15:
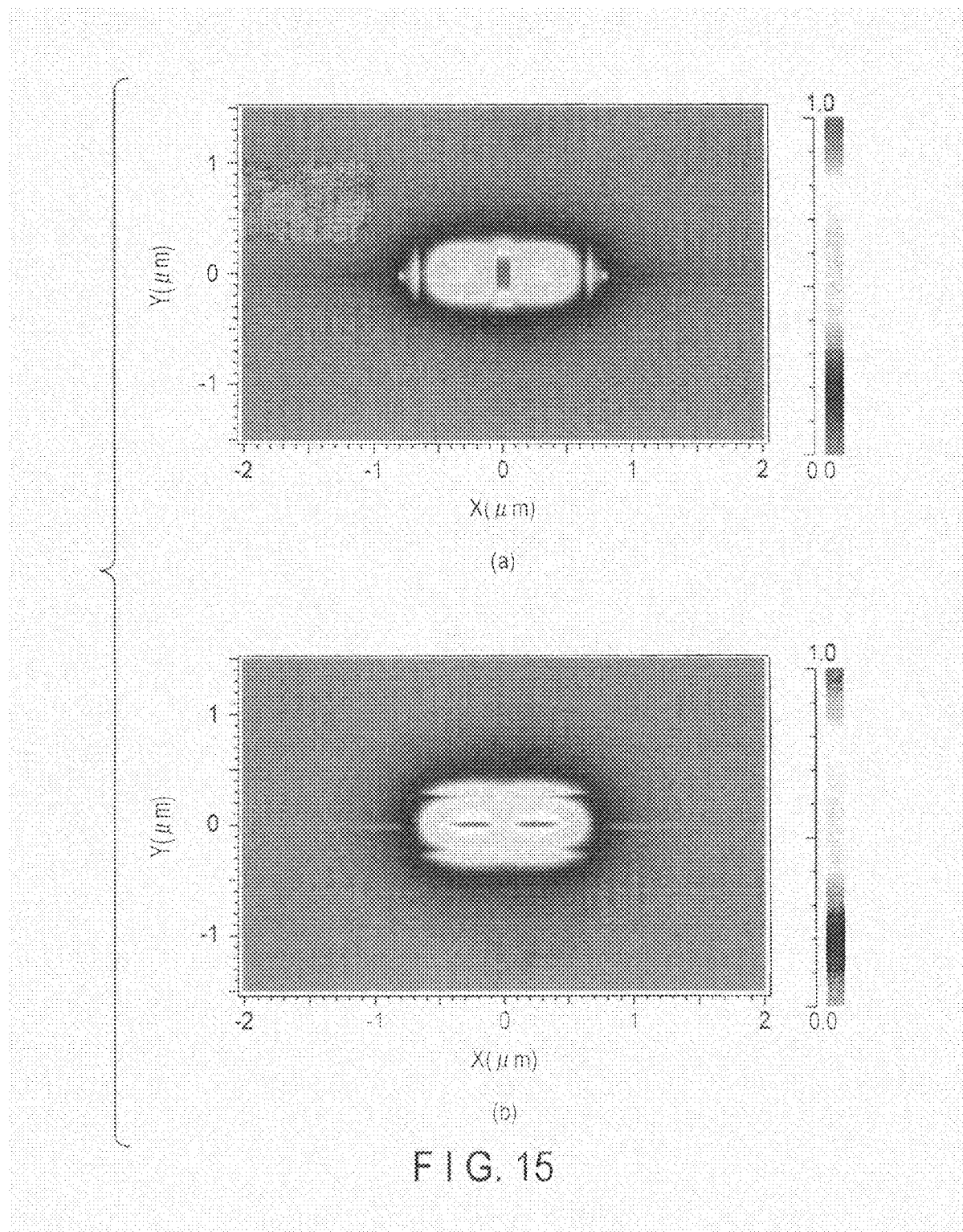
FIG. 15 is a graph showing a mode profile of (a) $E_x$ component of TE propagation mode light and (b) Ey component of TM propagation mode light.

The first high-refractive-index region 231a, the second high-refractive-index region 232a, the third high-refractive-index region 261a, and the fourth high-refractive-index region 262a can also be formed of an insulator material such as SiN. FIG. 15(a) and FIG. 15(b) show respective profiles of the TE mode light (effective refractive index $n_{eff}$=1.794, $E_x$ component) and the TM mode light ($n_{eff}$=1.761, Ey component), of wavelength 1.31 µm propagating the optical waveguide of the optical modulator in a case where a first SiN stripe 231a, a second SiN stripe 232a, a third SiN stripe 261a, and a fourth SiN stripe 262a have a thickness of 250 nm and a width of 600 nm, main slots 221 and 271 have a width of 100 nm, sub-slots 222 and 223 have a width of 150 nm, the refractive index of SiN is 2.1, first and second conductive semiconductor regions (conductive Si regions) 233 and 234 have a thickness of 40 nm. In this modified embodiment, light can also be propagated in the TM mode since the conductive Si regions 233 and 234 are thinned. An X axis and a Y axis in FIG. 15(a) and FIG. 15(b) correspond to a horizontal direction and a vertical direction, respectively, of the optical modulator of the modified embodiment. Center lines of the main slots 221 and 271 of the optical modulator of the modified embodiment correspond to X=0 (µm) in FIG. 15(a) and FIG. 15(b), and a boundary between an SiO$_2$ layer 220 and a first Al$_2$O$_3$ film 241 in the modified embodiment corresponds to Y=0 (µm) in FIG. 15(a) and FIG. 15(b). In addition, FIG. 15(a) and FIG. 15(b) are drawn without deformation. In FIG. 15(a), optical field intensity $E_x$ shows a maximum value 1 in the main slots 221 and 271. In FIG. 15(b), optical field intensity Ey shows a maximum value 1, in close vicinity of a portion sandwiched between the first high-refractive-index region 231a and the third high-refractive-index region 261a, and a portion sandwiched between the second high-refractive-index region 232a and the fourth high-refractive-index region 262a. Relationships between colors and the field strengths $E_x$ and Ey are shown on right sides of FIG. 15(a) and FIG. 15(b), respectively, where each of $E_x$ and Ey has a maximum value of 1 and a minimum value of 0.

Figure 16:
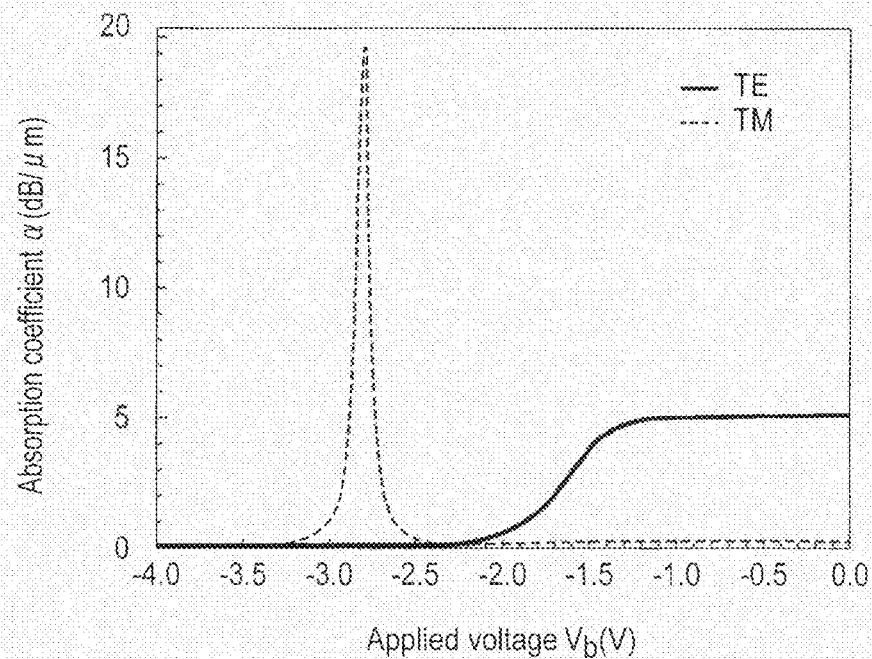
FIG. 16 is a graph showing an applied voltage dependence of an absorption coefficient in the modification.

FIG. 16 is a graph showing an applied voltage $V_b$ dependence of an absorption coefficient in the optical modulator of the modified embodiment. Since the mode size is larger as compared with a case of using silicon for the first to fourth high-refractive-index regions, the absorption coefficient of the TE mode light is smaller. However, if the device length is set to be longer, i.e., 50 µm, an extinction ratio of 12.3 dB and an insertion loss of 0.46 dB can be achieved by modulating the light at the applied voltage $V_b$ between −1V and −2.5V. Since the graphene capacitor in the modulator of the modified embodiment is wider, i.e., 1.3 µm, the modulation bandwidth is slightly narrower than a half of that in the optical modulator 201 of the embodiment. If the thickness of the Al$_2$O$_3$ layer 242 in the graphene is set at 4 to 5 nm, the modulation voltage becomes higher but high-speed modulation comparable to that in the graphene optical modulator of the embodiment can be executed.

The inter-band absorption of the graphene in the TM mode is weak, but a sharp absorption peak caused by resonance to the plasma oscillation is present near −2.81V. The optical modulation in the TM mode can be executed with this absorption peak. Since the absorption peak is sharp, modulation of a higher efficiency (lower modulation voltage and shorter device length) than the TE mode can be implemented if the fluctuation of the Fermi level is negligible. However, the modulation can easily be influenced by the fluctuation of the Fermi level as the absorption peak is sharp. When the absorption peak of the plasma oscillation is used, attention needs to be paid particularly to the manufacturing process such that variation in Fermi level becomes as small as possible.

In the graphene photodetector 1 of the embodiment, the structure in which the first high-refractive-index region 31 and the second high-refractive-index region 32 are not separated by a slot as shown in FIG. 6(c) is undesirable for the reason that the electrons and holes generated by the light absorption in the graphene film 50 need to be separated before recombination. In contrast, the optical modulator can function properly even in a structure in which the high-refractive-index regions 231 and 232 on the lower side or the high-refractive-index regions 261 and 262 on the upper side are separated into two parts. However, if the thickness of the high-refractive-index regions 231 and 232 on the lower side is different from the thickness of the high-refractive-index regions 261 and 262, the thicker regions should desirably be separated into two parts by the slot.

Figure 17:
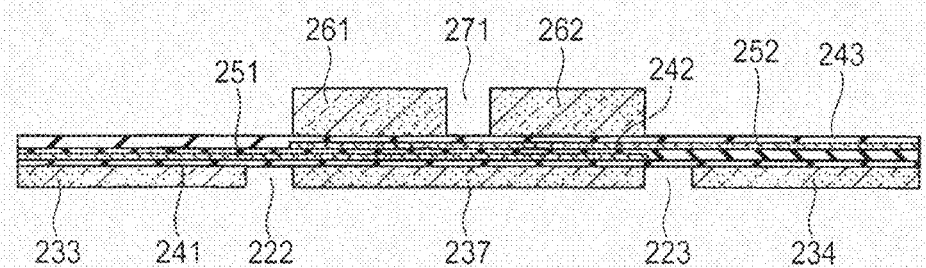
FIG. 17 is a schematic illustration showing a modification of the graphene optical modulator of the embodiment.

FIG. 17 is a schematic illustration showing a cross-section near the optical waveguide, of the graphene optical modulator of the modified embodiment in which the high-refractive-index region 237 on the lower side is not separated by a slot. The third high-refractive-index region (Si stripe) 261 and the fourth high-refractive-index region (Si stripe) 262 are disposed, sandwiching a main slot (fourth gap) 271, on the upper side of the graphene capacitor, and the first high-refractive-index region (Si stripe) 237 is disposed at a portion opposed to the third high-refractive-index region 261, the fourth high-refractive-index region 262, and the main slot 271, on the lower side of the graphene capacitor. Thus, the graphene optical modulator of the modified embodiment does not include a second high-refractive-index region. For example, the first high-refractive-index region 237 can be designed to have a thickness of 50 nm and a width of 550 nm, and each of the third high-refractive-index region (rail) 261 and the fourth high-refractive-index region (rail) 262 can be designed to have a thickness of 150 nm and a width of 225 nm. In addition, for example, the main slot 271 can be designed to have a width of 100 nm and the graphene capacitor can be designed to have a width of 600 nm. The first conductive semiconductor region 233 and the second conductive semiconductor region 234 can be designed to have a thickness of, for example, 50 nm, and sub-slots 222 and 223 between the first high-refractive-index region 237, and the first conductive semiconductor region 233 and the second conductive semiconductor region 234 can be designed to have a width of, for example, 125 nm. Constituent elements at the other portions are substantially the same as those of the graphene optical modulator 201 of the embodiment.

FIG. 18(a) and FIG. 18(b) show profiles of the $E_x$ component and the Ey component of the TE mode, of wavelength 1.31 µm propagating the graphene optical modulator of the modified embodiment to which specific numerical values exemplified in the explanations of the modified embodiment shown in FIG. 17 are applied. An X axis and a Y axis in FIG. 18(a) and FIG. 18(b) correspond to a horizontal direction and a vertical direction of the graphene optical modulator of the modified embodiment, respectively. A center line of the fourth gap 271 of the graphene optical modulator of the modified embodiment correspond to X=0 (µm) in FIG. 18(a) and FIG. 18(b), and a boundary between the first high-refractive-index region 237 and the first $Al_2O_3$ film 241 in the modified embodiment corresponds to Y=0 (µm) in FIG. 18(a) and FIG. 18(b). In addition, FIG. 18(a) and FIG. 18(b) are drawn without deformation. In the profile of FIG. 18(a), field intensity $E_x$ shows a maximum value 1 in the main slot 271. A relationship between colors and the field intensity $E_x$ in FIG. 18(a), where $E_x$ has a maximum value of 1 and a minimum value of 0, is shown on the right side of FIG. 18(a). In FIG. 18(b), the optical field intensity Ey shows a maximum value of 0.42308, in the graphene films 251 and 252 at a portion sandwiched between the first high-refractive-index region 237 and the third high-refractive-index region 261, and the graphene films 251 and 252 at a portion sandwiched between the first high-refractive-index region 237 and the fourth high-refractive-index region 262. A relationship between colors and the field intensity Ey in FIG. 18(b), where Ey has a maximum value of 0.42308 and a minimum value of 0, is shown on the right side of FIG. 18(b). In FIG. 18(a) and FIG. 18(b), the graphene films 251 and 252 are located near Y=0.0052 µm and Y=0.0075 µm since the thicknesses of the first $Al_2O_3$ film 241 and the second $Al_2O_3$ film 242 are approximately 5 nm (0.005 µm) and approximately 2 nm (0.002 µm), respectively. FIG. 18 (a) shows that even in the modified embodiment, the $E_x$ component is enhanced in the graphene films 251 and 252 under the main slot 271. In addition, the Ey component is also enhanced (i.e., approximately 40% of the peak of the $E_x$ component) in the graphene capacitor near the edges of the main slot 271, due to vertical asymmetry. The TM mode is leaky, since it is coupled with slab modes in the first conductive semiconductor region 233 and the second conductive semiconductor region 234.

FIG. 19 shows a voltage dependence of a light absorption coefficient for the TE mode in the graphene optical modulator of the modified embodiment shown in FIG. 17. The device length is assumed to be 30 µm. The extinction ratio is 12.9 dB and the insertion loss is 0.65 dB when the applied voltage $V_b$ is switched from −1V to −2.5V. Since the graphene optical modulator of the modified embodiment has a considerable vertical asymmetry, relatively large Ey component exists in the TE-mode in the graphene film, resulting in plasmon resonance absorption comparable to the inter-band absorption. Thus, a sharp absorption peak at around $V_b$=−2.82V caused by the plasma oscillation can also be used for the modulation of the TE mode, by the graphene optical modulator of the modified embodiment. For example, high-efficiency modulation with an extinction ratio of 14.0 dB can be realized in a 30-µm long optical modulator with a voltage amplitude of 0.48 Vpp (the applied voltage ranges from −2.82V to −3.3V). In this case, the insertion loss is 0.45 dB. However, if fluctuation of the Fermi level in the graphene film is not negligible, the sharp resonance peak cannot be obtained and modulation of high efficiency and high extinction ratio cannot be realized. Even when the inter-band absorption is used, if the absorption peak of the surface plasmon and the tail of the inter-band absorption overlap due to the fluctuation of the Fermi level, the extinction ratio is reduced and the insertion loss is increased.

Contrary to the modified embodiment noted above, another modified embodiment may be implemented, in which the first and second high-refractive-index regions are likewise disposed below the graphene capacitor, sandwiching the main slot (first gap) 221, but only one high-refractive-index region (third high-refractive-index region) is present above the graphene capacitor. In this case, the third high-refractive-index region should desirably be thicker than the first and second high-refractive-index regions.

Thus, the graphene optical modulator of the embodiment and the modified embodiment can solve the problems of the graphene optical modulator such as a low extinction ratio and a slow modulation speed, and provide an optical modulator of a high efficiency, a small size, a high speed and a wide wavelength band.

Since steps of manufacturing the graphene optical modulator 201 of the embodiment are completed by adding steps of stacking another graphene film and another Al$_2$O$_3$ layer to the steps of manufacturing the graphene photodetector 1 of the embodiment, the graphene optical modulator and the graphene photodetector can easily be integrated on a substrate. Since both a footprint of the graphene photodetector 1 of the embodiment and a footprint of the graphene photodetector 201 of the embodiment are small and since graphene photodetector 1 and the graphene photodetector 201 have high compatibility with a CMOS process, a high-density on-chip optical interconnect can be formed on LSI.

FIG. 20 is a schematic illustration showing an optical wiring layer on an LSI chip 400 on which the graphene photodetector 1 of the embodiment and the graphene optical modulator 201 of the embodiment are integrated. An optical device which is one of constituent element is much smaller as compared with the size of an LSI chip (>1 cm) and a large number of optical devices are actually integrated, but several devices alone are drawn in a larger size than the actual size for convenience of explanations.

Laser light is made incident on a grating coupler 411 from an optical fiber (not shown) to be coupled to a fundamental TE mode of an Si strip waveguide (first region) 421. The light coupled to the Si strip waveguide (first region) 421 is branched into a plurality of Si strip waveguides (second regions) 422 by an optical splitter 412. One branch will be hereinafter explained but the other branches are the same in configuration and effect. An optical interconnect connected to the other grating coupler is also the same in basic configuration.

The light branched to each Si strip waveguide (second region) 422 is guided to a first Si slot waveguide 441 via a first strip-slot-mode converter 431 and modulated by the graphene optical modulator 201 of the embodiment provided on the first Si slot waveguide 441. The modulated light is output to an Si strip waveguide 423 via a second strip-slot-mode converter 432. The signal light transmitted through the Si strip waveguide 423 is guided to the second Si slot waveguide 442 via a third strip-slot-mode converter 433 and converted into an electric signal by the graphene photodetector 1 of the embodiment provided at the end of the second Si slot waveguide 442. The graphene optical modulator 201 and the graphene photodetector 1 are integrated with a driver circuit and a receiver circuit, respectively, which are not shown in the drawings.

FIG. 20 only shows an applied example of the present embodiment and various modifications can be conceived. The laser light input to the graphene optical modulator may be input from an outside of the chip via a spot-size converter provided at a chip end instead of the grating coupler, or may be supplied from a laser (such as an Si hybrid laser) integrated on the same chip. Two branches are formed for one input in the drawing, but four to sixteen branches can be formed and arranged in parallel. In addition, in general, when the wiring length from the graphene optical modulator 201 to the graphene photodetector 1 is short, the optical modulator may be connected to the photodetector by a slot waveguide, not via mode converters and a strip waveguide. The Al$_2$O$_3$ layers 41, 42, 241, 242 and 243 may be left or removed, inside the Si strip waveguides 421, 422 and 423. Besides the above-explained elements and devices, various optical devices such as optical switches, polarization beam splitters, polarization rotators, MMI couplers, and directional couplers may be integrated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A graphene optical modulator, comprising:
a substrate;
a first insulating film provided on the substrate;
first and second high-refractive-index regions provided in a surface region of the first insulating film, and spaced apart from each other with a first gap therebetween;
first and second conductive semiconductor regions provided on sides of the first and second high-refractive-index regions opposite to the second and first high-refractive-index regions, respectively, and spaced apart with second and third gaps between the first high-refractive-index region and the first conductive semiconductor region, and between the second high-refractive-index region and the second conductive semiconductor region, respectively;
a second insulating film provided to cover surfaces of the first and second high-refractive-index regions, and the first, second and third gaps, and to extend over the first and second conductive semiconductor regions;
a first graphene film provided on the second insulating film to span the first and second gaps;
a third insulating film provided to cover the first graphene film and to extend over the second insulating film;
a second graphene film provided on the third insulating film to span the first and third gaps;
a fifth insulating film provided to cover the second graphene film and to extend over the third insulating film;
third and fourth high-refractive-index regions provided on the fifth insulating film, at locations corresponding to the first and second high-refractive-index regions, respectively, and spaced apart with a fourth gap therebetween;
a fourth insulating film provided to cover the third and fourth high-refractive-index regions and to extend over the fifth insulating film;
a first electrode provided on the first graphene film, on a side of the third high-refractive-index region opposite to the fourth high-refractive-index region to electrically contact with the first graphene film;
a second electrode provided on the second graphene film, on a side of the fourth high-refractive-index region opposite to the third high-refractive-index region to electrically contact with the second graphene film; and
third and fourth electrodes provided to electrically contact with the first and second high-conductive semiconductor regions, respectively,
the first, second, third and fourth high-refractive-index regions each having a refractive index higher than refractive indices of the first and fourth insulating films,
the first, second, third and fourth high-refractive-index regions and portions sandwiched by the first, second, third and fourth high-refractive-index regions constituting an integrated optical waveguide, an intensity of light propagating in the optical waveguide being modulated based on a voltage applied between the first electrode and the second electrode.

2. The graphene optical modulator of claim 1, wherein the first graphene film and the second graphene film are single-crystal graphene.

3. The graphene optical modulator of claim 1, wherein if bias voltages applied to the first electrode, the second electrode, the third electrode and the fourth electrode are $V_1$, $V_2$, $V_3$, and $V_4$, respectively, the bias voltages have a relationship of $V_3>V_1<V_2>V_4$ or $V_3<V_1>V_2<V_4$.

4. The graphene optical modulator of claim 1, integrated with a graphene photodetector comprising:
a sixth insulating film provided on the substrate;
seventh and eighth high-refractive-index regions provided in a surface region of the sixth insulating film, and spaced apart from each other with a seventh gap therebetween;
third and fourth conductive semiconductor regions provided on sides of the seventh and eighth high-refractive-index regions opposite to the eighth and seventh high-refractive-index regions, respectively, and spaced apart with eighth and ninth gaps between the seventh high-refractive-index region and the third conductive semiconductor region, and between the eighth high-refractive-index region and the fourth conductive semiconductor region, respectively;
a seventh insulating film provided to cover surfaces of the seventh and eighth high-refractive-index regions, and the seventh, eighth and ninth gaps, and to extend over the third and fourth conductive semiconductor regions;
a third graphene film provided on the seventh insulating film to span the seventh to ninth gaps;
an eighth insulating film provided to cover the third graphene film and to extend over the seventh insulating film;
ninth and tenth high-refractive-index regions provided on the eighth insulating film, at locations corresponding to the seventh and eighth high-refractive-index regions, respectively, and spaced apart with a tenth interval defining a tenth gap therebetween;
a ninth insulating film provided to cover the ninth and tenth high-refractive-index regions and to extend over the eighth insulating film;
fifth and sixth electrodes provided on the third graphene film, on sides of the ninth and tenth high-refractive-index regions opposite to the tenth and ninth high-refractive-index regions, respectively, to electrically contact with the third graphene film; and
seventh and eighth electrodes provided to electrically contact with the third and fourth conductive semiconductor regions, respectively,
the seventh, eighth, ninth and tenth high-refractive-index regions each having a refractive index higher than refractive indices of the sixth and ninth insulating films,
the seventh, eighth, ninth and tenth high-refractive-index regions and portions sandwiched by the seventh, eighth, ninth and tenth high-refractive-index regions constituting an integrated second optical waveguide,
a current corresponding to light incident on the second optical waveguide being output from the fifth and sixth electrodes.

5. A graphene optical modulator, comprising:
a substrate;
a first insulating film provided on the substrate;
a first high-refractive-index region provided in a surface region of the first insulating film;
first and second conductive semiconductor regions provided on sides of the first high-refractive-index region, and spaced apart with second and third gaps between the first high-refractive-index region and the first conductive semiconductor region, and between the first high-refractive-index region and the second conductive semiconductor region, respectively;
a second insulating film provided to cover a surface of the first high-refractive-index region and the second and third gaps, and to extend over the first and second conductive semiconductor regions;
a first graphene film provided on the second insulating film;
a third insulating film provided to cover the first graphene film and to extend over the second insulating film;
a second graphene film provided on the third insulating film;
a fifth insulating film provided to cover the second graphene film and to extend over the third insulating film;
third and fourth high-refractive-index regions provided on the fifth insulating film, at a location corresponding to the first high-refractive-index region, and spaced apart with a fourth gap therebetween;
a fourth insulating film provided to cover the third and fourth high-refractive-index regions and to extend over the fifth insulating film;
a first electrode provided on the first graphene film, on a side of the third high-refractive-index region opposite to the fourth high-refractive-index region to electrically contact with the first graphene film;
a second electrode provided on the second graphene film, on a side of the fourth high-refractive-index region opposite to the third high-refractive-index region to electrically contact with the second graphene film; and
third and fourth electrodes provided to electrically contact with the first and second conductive semiconductor regions, respectively,
the first, third and fourth high-refractive-index regions each having a refractive index higher than refractive indices of the first and fourth insulating films,
the first, third and fourth high-refractive-index regions and portions sandwiched by the first, third and fourth high-refractive-index regions constituting an integrated optical waveguide,
the first graphene film being provided to span the second and fourth gaps,
the second graphene film being provided to span the third and fourth gaps,
an intensity of light propagating in the optical waveguide being modulated based on a voltage applied between the first electrode and the second electrode.

6. A graphene optical modulator, comprising:
a substrate;
a first insulating film provided on the substrate;
first and second high-refractive-index regions provided in a surface region of the first insulating film, and spaced apart from each other with a first gap therebetween;
first and second conductive semiconductor regions provided on sides of the first and second high-refractive-index regions opposite to the second and first high-refractive-index regions, respectively, and spaced apart with second and third gaps between the first high-refractive-index region and the first conductive semiconductor region, and between the second high-refractive-index region and the second conductive semiconductor region, respectively;
a second insulating film provided to cover surfaces of the first and second high-refractive-index regions, and the first, second and third gaps, and to extend over the first and second conductive semiconductor regions;
a first graphene film provided on the second insulating film to span the first and second gaps;
a third insulating film provided to cover the first graphene film and to extend over the second insulating film;
a second graphene film provided on the third insulating film to span the first and third gaps;
a fifth insulating film provided to cover the second graphene film and to extend over the third insulating film;
a third high-refractive-index region provided on the fifth insulating film, at a location corresponding to the first and second high-refractive-index regions;
a fourth insulating film provided to cover the third high-refractive-index region and to extend over the fifth insulating film;
a first electrode provided on the first graphene film to electrically contact with the first graphene film outside the third high-refractive-index region;
a second electrode provided on the second graphene film to electrically contact with the second graphene film on a side of the third high-refractive-index region opposite to the first electrode; and
third and fourth electrodes provided to electrically contact with the first and second high-conductive semiconductor regions, respectively,
the first, second, and third high-refractive-index regions each having a refractive index higher than refractive indices of the first and fourth insulating films,
the first, second, and third high-refractive-index regions and portions sandwiched by the first, second, and third high-refractive-index regions constituting an integrated optical waveguide,
an intensity of light propagating in the optical waveguide being modulated based on a voltage applied between the first electrode and the second electrode.

7. A graphene optical modulator, comprising:
a substrate;
a first insulating film provided on the substrate;
first and second high-refractive-index regions provided in a surface region of the first insulating film, and spaced apart from each other with a first gap therebetween;
a fifth high-refractive-index region provided in the surface region of the first insulating film, on a side of the second high-refractive-index region opposite to the first high-refractive-index region, and spaced apart from the second high-refractive-index region with a fifth gap;
first and second conductive semiconductor regions provided on sides of the first and fifth high-refractive-index regions opposite to the second high-refractive-index region, respectively, and spaced apart with second and third gaps between the first high-refractive-index region and the first conductive semiconductor region, and between the fifth high-refractive-index region and the second conductive semiconductor region, respectively;
a second insulating film provided to cover surfaces of the first, second and fifth high-refractive-index regions, and the first, second, third and fifth gaps, and to extend over the first and second conductive semiconductor regions;
a first graphene film provided on the second insulating film to span the first, second and fifth gaps;
a third insulating film provided to cover the first graphene film and to extend over the second insulating film;
a second graphene film provided on the third insulating film to span the first, third and fifth gaps;
a fifth insulating film provided to cover the second graphene film and to extend over the third insulating film;
third and fourth high-refractive-index regions provided on the fifth insulating film, at locations corresponding to the first and second high-refractive-index regions, respectively, and spaced apart from each other with a fourth gap;
a sixth high-refractive-index region provided on the fifth insulating film, at a location corresponding to the fifth high-refractive-index region, on a side of the fourth high-refractive-index region opposite to the third high-refractive-index region, and spaced apart from the fourth high-refractive-index region with a sixth gap;
a fourth insulating film provided to cover the third, fourth and sixth high-refractive-index regions and to extend over the fifth insulating film;
a first electrode provided on the first graphene film to electrically contact with the first graphene film on a side of the third high-refractive-index region opposite to the fourth high-refractive-index region;
a second electrode provided on the second graphene film to electrically contact with the second graphene film on a side of the sixth high-refractive-index region opposite to the fourth high-refractive-index region; and
third and fourth electrodes provided to electrically contact with the first and second conductive semiconductor regions, respectively,
the first, second, third, fourth, fifth and sixth high-refractive-index regions each having a refractive index higher than refractive indices of the first and fourth insulating films,
the first, second, third, fourth, fifth and sixth high-refractive-index regions and portions sandwiched by the first, second, third, fourth, fifth and sixth high-refractive-index regions constituting an integrated optical waveguide,
an intensity of light propagating in the optical waveguide being modulated based on a voltage applied between the first electrode and the second electrode.

* * * * *